United States Patent
Takizawa et al.

(10) Patent No.: US 10,395,723 B2
(45) Date of Patent: Aug. 27, 2019

(54) MEMORY SYSTEM THAT DIFFERENTIATES VOLTAGES APPLIED TO WORD LINES

(71) Applicant: Toshiba Memory Corporation, Tokyo (JP)

(72) Inventors: Kazutaka Takizawa, Yokohama Kanagawa (JP); Masaaki Niijima, Machida Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/687,103

(22) Filed: Aug. 25, 2017

(65) Prior Publication Data

US 2018/0261275 A1   Sep. 13, 2018

Related U.S. Application Data

(60) Provisional application No. 62/468,206, filed on Mar. 7, 2017.

(51) Int. Cl.
  *G11C 16/08*  (2006.01)
  *G11C 11/408* (2006.01)
  *G11C 11/413* (2006.01)
  *G11C 5/02*   (2006.01)
  *G11C 8/08*   (2006.01)
  (Continued)

(52) U.S. Cl.
  CPC .......... *G11C 11/4085* (2013.01); *G11C 5/025* (2013.01); *G11C 5/147* (2013.01); *G11C 8/08* (2013.01); *G11C 8/14* (2013.01); *G11C 11/413* (2013.01)

(58) Field of Classification Search
  CPC ..... G11C 11/4085; G11C 5/025; G11C 5/147; G11C 16/08
  USPC ........................................ 365/185.23, 185.17
  See application file for complete search history.

(56) References Cited

U.S. PATENT DOCUMENTS

| | | | |
|---|---|---|---|
| 7,443,726 B2 | 10/2008 | Guterman | |
| 7,688,632 B2 * | 3/2010 | Nagashima | G11C 16/12 365/185.11 |
| 8,605,514 B2 | 12/2013 | Shiino et al. | |

(Continued)

FOREIGN PATENT DOCUMENTS

| | | |
|---|---|---|
| JP | 2007226936 A | 9/2007 |
| JP | 2009176372 A | 8/2009 |

(Continued)

*Primary Examiner* — Tha-O H Bui
*Assistant Examiner* — Alfredo Bermudez Lozada
(74) *Attorney, Agent, or Firm* — Kim & Stewart LLP

(57) ABSTRACT

A memory system includes a semiconductor memory chip including a substrate, an array of memory cells in arranged each of a plurality of levels in a thickness direction of the substrate, and a plurality of word lines arranged in the thickness direction, each of the word lines being connected to memory cells in one of the levels, and a controller. The controller is configured to determine an offset value with respect to each of a plurality of word line groups that are organized from the plurality of word lines along the thickness direction, and, with respect to each of the word line groups, set a voltage to be applied to the word line group during at least one of write, read, and erase operations, based on a base parameter value and the offset value corresponding to the word line group.

20 Claims, 17 Drawing Sheets

| | FIRST GROUP | SECOND GROUP | THIRD GROUP | ... | (N-1)TH GROUP | N-TH GROUP |
|---|---|---|---|---|---|---|
| COMMON REFERENCE BIAS PARAMETER | Y | Y | Y | ... | Y | Y |
| BIAS PARAMETER OFFSET VALUE | A | B | C | ... | M | N |
| COMMON REFERENCE STEP PARAMETER | y | y | y | ... | y | y |
| STEP PARAMETER OFFSET VALUE | a | b | c | ... | m | n |
| ADJUSTED PARAMETER | (Y+A)+(y+a) | (Y+B)+(y+b) | (Y+C)+(y+c) | ... | (Y+M)+(y+m) | (Y+N)+(y+n) |

(51) Int. Cl.
*G11C 5/14* (2006.01)
*G11C 8/14* (2006.01)

(56) References Cited

U.S. PATENT DOCUMENTS

| | | | |
|---|---|---|---|
| 8,670,279 | B2 | 3/2014 | Yoon |
| 8,737,138 | B2 | 5/2014 | Pio |
| 9,064,580 | B2 | 6/2015 | Senoo et al. |
| 9,653,157 | B1* | 5/2017 | Kim ................... G11C 11/5642 |
| 2012/0081958 | A1* | 4/2012 | Lee ................... G11C 16/0483 |
| | | | 365/185.05 |
| 2012/0213004 | A1* | 8/2012 | Yun ................... G11C 11/5642 |
| | | | 365/185.11 |
| 2012/0213005 | A1 | 8/2012 | Lee |
| 2014/0313832 | A1* | 10/2014 | Meir .................... G11C 16/10 |
| | | | 365/185.17 |
| 2015/0262669 | A1* | 9/2015 | Kamata .............. G11C 16/0483 |
| | | | 365/185.05 |
| 2017/0117032 | A1 | 4/2017 | Takizawa et al. |
| 2017/0179027 | A1* | 6/2017 | Kim ................. H01L 27/11286 |
| 2017/0287568 | A1* | 10/2017 | Yang ................. G11C 16/3431 |

FOREIGN PATENT DOCUMENTS

| | | | |
|---|---|---|---|
| JP | 4892566 | B2 | 3/2012 |
| JP | 2012174331 | A | 9/2012 |
| JP | 5238741 | B2 | 7/2013 |
| JP | 5827536 | B2 | 12/2015 |

\* cited by examiner

FIG. 7

| NUMBER OF WRITES | BOARD SURFACE TEMPERATURE | ACCESS FREQUENCY | ACCESS SPEED | APPLICATION VOLTAGE |
|---|---|---|---|---|
| N1 | T1 | F1 | V1 | VT1 |
| N2 | T2 | F2 | V2 | VT2 |
| N3 | T3 | F3 | V3 | VT3 |
| ⋮ | ⋮ | ⋮ | ⋮ | ⋮ |

FIG. 8

| | FIRST GROUP | SECOND GROUP | THIRD GROUP | ... | (N−1)TH GROUP | N-TH GROUP |
|---|---|---|---|---|---|---|
| COMMON REFERENCE PARAMETER | X | X | X | ... | X | X |
| PARAMETER OFFSET VALUE | $\alpha$ | $\beta$ | $\gamma$ | ... | $\mu$ | $\nu$ |
| ADJUSTED PARAMETER | $X+\alpha$ | $X+\beta$ | $X+\gamma$ | ... | $X+\mu$ | $X+\nu$ |

|  | FIRST GROUP | SECOND GROUP | THIRD GROUP | ... | (N-1)TH GROUP | N-TH GROUP |
|---|---|---|---|---|---|---|
| COMMON REFERENCE BIAS PARAMETER | Y | Y | Y | ... | Y | Y |
| BIAS PARAMETER OFFSET VALUE | A | B | C | ... | M | N |
| COMMON REFERENCE STEP PARAMETER | y | y | y | ... | y | y |
| STEP PARAMETER OFFSET VALUE | a | b | c | ... | m | n |
| ADJUSTED PARAMETER | (Y+A)+(y+a) | (Y+B)+(y+b) | (Y+C)+(y+c) | ... | (Y+M)+(y+m) | (Y+N)+(y+n) |

FIG. 14

|  | FIRST GROUP | SECOND GROUP | THIRD GROUP | ... | (N−1)TH GROUP | N-TH GROUP |
|---|---|---|---|---|---|---|
| COMMON REFERENCE PARAMETER | X | X | X | ... | X | X |
| OFFSET VALUE IN FIRST FATIGUE LEVEL RANGE | $\alpha_1$ | $\beta_1$ | $\gamma_1$ | ... | $\mu_1$ | $\nu_1$ |
| ADJUSTED PARAMETER | $X+\alpha_1$ | $X+\beta_1$ | $X+\gamma_1$ | ... | $X+\mu_1$ | $X+\nu_1$ |
| OFFSET VALUE IN SECOND FATIGUE LEVEL RANGE | $\alpha_2$ | $\beta_2$ | $\gamma_2$ | ... | $\mu_2$ | $\nu_2$ |
| ADJUSTED PARAMETER | $X+\alpha_2$ | $X+\beta_2$ | $X+\gamma_2$ | ... | $X+\mu_2$ | $X+\nu_2$ |
| ⋮ | ⋮ | ⋮ | ⋮ | ⋮ | ⋮ | ⋮ |
| OFFSET VALUE IN n-th FATIGUE LEVEL RANGE | $\alpha_n$ | $\beta_n$ | $\gamma_n$ | ... | $\mu_n$ | $\nu_n$ |
| ADJUSTED PARAMETER | $X+\alpha_n$ | $X+\beta_n$ | $X+\gamma_n$ | ... | $X+\mu_n$ | $X+\nu_n$ |

FIG. 16

|  | FIRST PILLAR | SECOND PILLAR | THIRD PILLAR | FOURTH PILLAR |
|---|---|---|---|---|
| FIRST WORD LINE | GROUP (1, 1) | GROUP (1, 2) | GROUP (1, 3) | GROUP (1, 4) |
| SECOND WORD LINE | | | | |
| THIRD WORD LINE | GROUP (2, 1) | GROUP (2, 2) | GROUP (2, 3) | GROUP (2, 4) |
| FOURTH WORD LINE | | | | |
| ⋮ | ⋮ | ⋮ | ⋮ | ⋮ |
| (n-1)th WORD LINE | GROUP (i, 1) | GROUP (i, 2) | GROUP (i, 3) | GROUP (i, 4) |
| n-th WORD LINE | | | | |

MEMORY SYSTEM THAT DIFFERENTIATES VOLTAGES APPLIED TO WORD LINES

CROSS-REFERENCE TO RELATED APPLICATIONS

This application is based upon and claims the benefit of priority from U.S. Provisional Patent Application No. 62/468,206, filed on Mar. 7, 2017, the entire contents of which are incorporated herein by reference.

FIELD

Embodiments described herein relate generally to a memory system and a method for controlling a memory system.

BACKGROUND

A memory system of one type including a solid state drive (SSD) that includes a plurality of memory cells, and a controller that controls writing and reading of data with respect to the plurality of memory cells.

BRIEF DESCRIPTION OF THE DRAWINGS

FIG. 7 illustrates an operation management table according to the first embodiment.

FIG. 8 illustrates an example of an operation parameter setting method according to the first embodiment.

FIG. 14 illustrates an example of an operation parameter setting method according to a second modified example of the first embodiment.

FIG. 16 schematically illustrates grouping according to a second embodiment.

DETAILED DESCRIPTION

Figure 1:
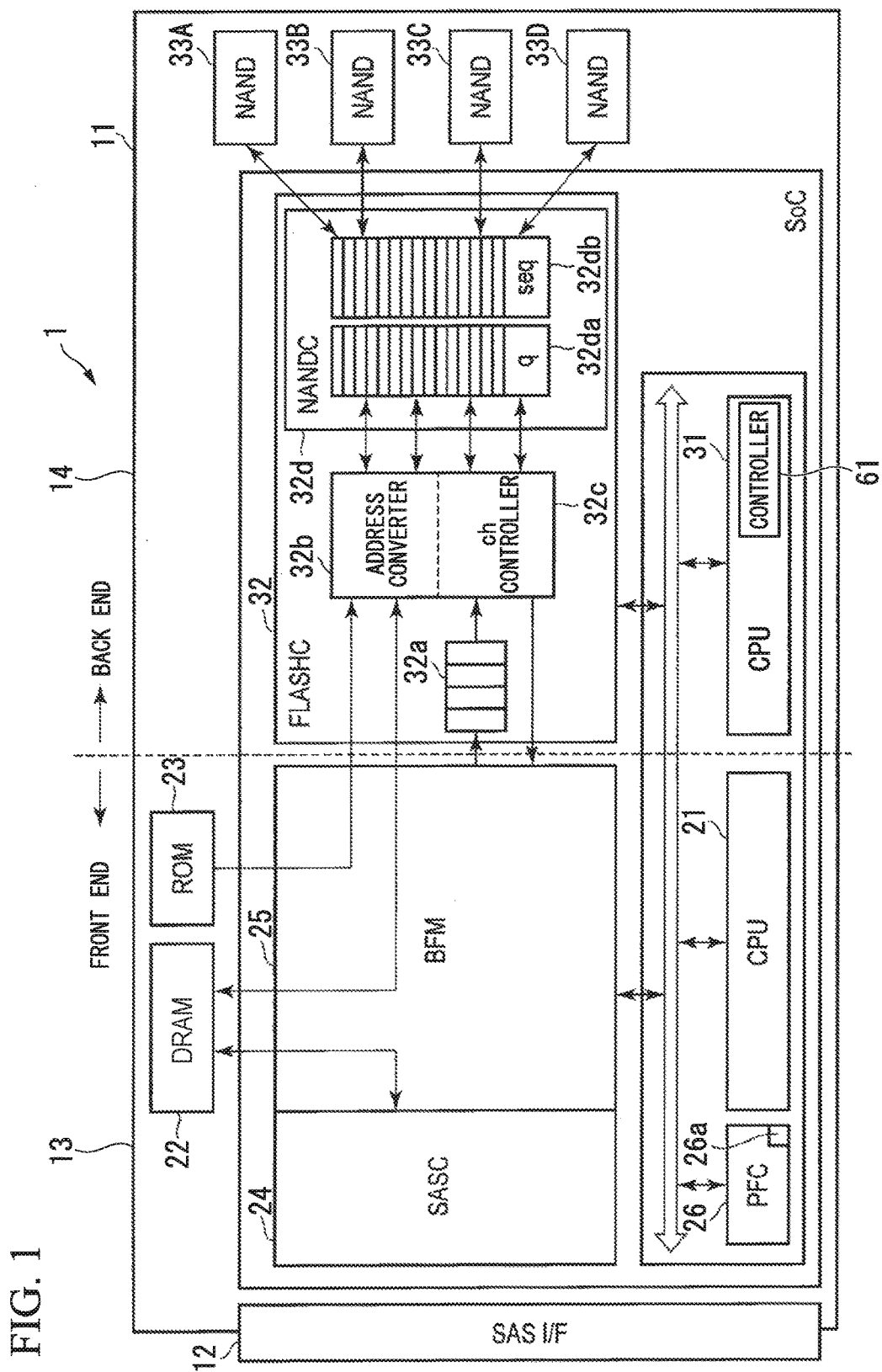
FIG. 1 is a block diagram of a memory system according to a first embodiment.

A memory system according to an embodiment includes a semiconductor memory chip including a substrate, an array of memory cells in arranged each of a plurality of levels in a thickness direction of the substrate, and a plurality of word lines arranged in the thickness direction, each of the word lines being connected to memory cells in one of the levels, and a controller. The controller is configured to determine an offset value with respect to each of a plurality of word line groups that are organized from the plurality of word lines along the thickness direction, and, with respect to each of the word line groups, set a voltage to be applied to the word line group during at least one of write, read, and erase operations, based on a base parameter value and the offset value corresponding to the word line group.

Hereinafter, a memory system and a method for controlling a memory system according to embodiments will be described with reference to the drawings. In the following description, elements having the same or similar function will be denoted by the same reference numerals, and redundant description of these constituent elements may be omitted. "A voltage is high" or "a voltage is low" used in the embodiments means that "a voltage level is high" or "a voltage level is low". Furthermore, "based on XX (or on the basis of)" used in the present application may be replaced with "using XX" or may be replaced with "obtaining XX". "Obtain" may include a case of receiving the same from a host (for example, a higher-layer controller such as a server) in addition to a case of reading the same from a storage unit of the memory system. Moreover, "obtain" may include a case of receiving the same passively in addition to a case of acquiring the same positively. Furthermore, "based on XX (or on the basis of)" used in the present application means "based on at least XX" and includes a case of being based on another element in addition to XX. Furthermore, "based on XX (or on the basis of)" is not limited to a case of using XX directly but also includes a case of being based on something obtained by performing operations or processing on XX. "XX" is an arbitrary element (for example, an arbitrary indicator, physical quantity, or other information).

For example, in NAND flash memories, operation parameters are set so that, when a write operation, a read operation, or an erase operation is performed, substantially the same voltage is applied to all word lines connected to the same block. However, with a reduction in scaling of manufacturing processes of recent memory systems, it may not be always desirable to apply substantially the same voltage to all word lines included in the same block due to a difference in manufacturing dimensions of a plurality of memory cells, the Yupin effect received from adjacent word lines, and the like. For example, in a case where word lines connected to the same block are classified into a plurality of groups and voltages of different voltage levels are applied to respective groups, it may be possible to suppress fatigue (i.e., wear) of memory cells and to improve the lifespan and the performance of memory systems.

First Embodiment

A first embodiment will be described with reference to FIGS. 1 to 12. FIG. 1 shows an example of a memory system 1 according to the first embodiment. The memory system 1 is an SSD, for example.

[1. Entire Configuration of Memory System]

As shown in FIG. 1, the memory system 1 includes a board 11, a serial attached SCSI (SAS) interface (SAS I/F) 12, a front end 13, and a back end 14, for example. The SAS I/F 12, the front end 13, and the back end 14 are provided on the board 11. The memory system 1 is connected to a higher-layer controller (not shown) (hereinafter referred to as a host) such as a server via the SAS I/F 12 and functions as an external memory.

The front end 13 transmits and receives commands and data between the front end 13 and a host via the SAS I/F 12. The front end 13 includes a CPU 21, a dynamic random access memory (DRAM) 22 as an example of a volatile memory, a read only memory (ROM) 23 as an example of a nonvolatile memory, a SAS controller (SASC) 24, a buffer manager 25, and a peripheral circuit (PFC) 26.

The front end 13 processes commands supplied from the host. That is, the front end 13 receives commands from the host via the SAS controller 24 and transmits the commands to the back end 14 in a case where the type of the commands is a data read request or a data write request.

The CPU 21 controls the buffer manager 25 and the DRAM 22, which is used as a write buffer and a read buffer, in cooperation with a CPU 31 of the back end 14, and transmits data between the host and the DRAM 22 and between the DRAM 22 and the back end 14. Such function of the front end 13 is realized by software (or firmware) executed on the CPU 21.

The ROM 23 stores values of an operation management table T (see FIG. 7) that is used to manage various operations of NANDs 33A to 33D of the back end 14. The values of the operation management table T are read from the ROM 23 and supplied to the back end 14 so as to be used for controlling the operations of the NANDs 33A to 33D.

The peripheral circuit 26 includes a control circuit of a power supply and a temperature sensor 26a that detects the temperature of the board 11, for example. The temperature sensor 26a is formed by a thermocouple, for example. The temperature detected by the temperature sensor 26a can be regarded as the temperature of a NAND chip since the temperature detected by the temperature sensor 26a is substantially the same as the temperature of a package of the respective NANDs 33A to 33D in which a plurality of NAND chips is accommodated.

The back end 14 includes a CPU 31, a flash controller 32, and a plurality of NANDs (NAND packages) 33A to 33D, for example.

The flash controller 32 includes a command queue 32a, an address converter 32b, a channel (ch) controller 32c, and a NAND controller (NANDC) 32d. The NAND controller 32d includes a command queue (q) 32da and a sequencer (seq) 32db, for example.

The command queue 32a retains various commands supplied from the front end 13. The address converter 32b converts logical addresses to physical addresses. A portion of the physical addresses may specify a word line to be accessed, or the flash controller 32 may determine the word line to be accessed based on the physical addresses, using a formula. The channel controller 32c distributes commands and data to respective NANDs 33A to 33D. For example, the channel controller 32c distributes the commands from the command queue 32a to the NANDs 33A to 33D according to addresses. The NAND controller 32d controls the operations of the NANDs 33A to 33D. For example, the NAND controller 32d converts the commands in the command queue 32da to commands for the NANDs 33A to 33D. The sequencer 32db controls the operations of the plurality of NANDs 33A to 33D according to the converted commands. Such function of the back end 14 is realized by software (or firmware) executed on the CPU 31.

The NANDs 33A to 33D each include a plurality of NAND flash memory chips (hereinafter referred to as NAND chips or semiconductor chips) 40, for example.

Figure 2:
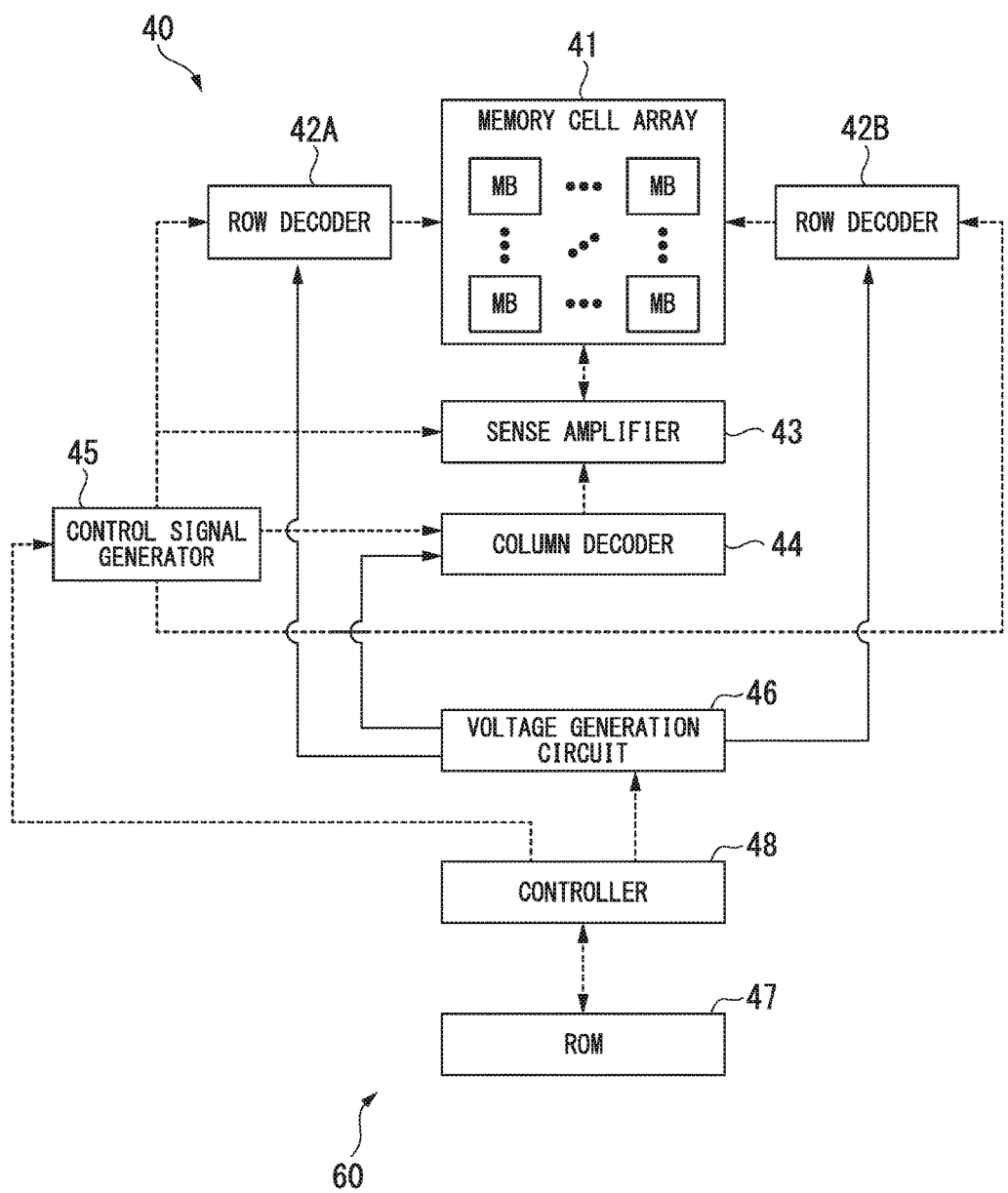
FIG. 2 is a block diagram of a NAND chip according to the first embodiment.

FIG. 2 shows an example of an inner configuration of the NAND chip 40.

As shown in FIG. 2, the NAND chip 40 includes a memory cell array 41, row decoders 42A and 42B, a sense amplifier 43, a column decoder 44, a control signal generator 45, a voltage generation circuit 46, a ROM 47, and a controller 48.

The memory cell array 41 includes a plurality of memory blocks MB. The memory block MB is a smallest erasure unit, for example. Each memory block MB includes a plurality of memory cells MC (see FIG. 3) arranged three-dimensionally. The memory cell array 41 will be described in detail below.

The row decoders 42A and 42B each are an example of a driving circuit that drives the memory cell array 41. The row decoders 42A and 42B decode block address signals and the like and control a data write operation, a data read operation, and the like of the memory cell array 41. The sense amplifier 43 detects and amplifies electrical signals flowing in the memory cell array 41 during a read operation. The column decoder 44 decodes column address signals and controls the sense amplifier 43. The control signal generator 45 generates control signals on the basis of the control of the controller 48 and controls the row decoders 42A and 42B, the sense amplifier 43, and the column decoder 44.

The voltage generation circuit 46 outputs pulses of arbitrary voltage levels and arbitrary timings on the basis of the control of the controller 48. The pulses generated by the voltage generation circuit 46 are transmitted to arbitrary word lines WL and arbitrary bit lines BL (to be described below) selected by the row decoders 42A and 42B and the column decoder 44. In this way, the voltage generation circuit 46 applies voltages of arbitrary voltage levels to a plurality of word lines WL and a plurality of bit lines BL. The voltage generation circuit 46 is an example of a "circuit". In other words, the voltage generation circuit 46 applies voltages of arbitrary voltage levels to the plurality of word lines WL and a plurality of pillars 57 (to be described below).

The ROM 47 is writable. The ROM 47 may be a partial area of the memory cell array 41. For example, the ROM 47 retains a latest operation management table T (see FIG. 7) and an operation log of the NAND chip 40. The "operation log" is an operation history in each process of the NAND chip 40 and is the numbers of writes, erases, loops, and reads and a resting time of each memory cell MC, for example. In the ROM 47, the information of each operation history is frequently updated with the use of the NAND chip 40.

The controller 48 controls operations such as write, read, and erase of the memory cell array 41 according to the commands supplied from the sequencer 32db and the parameter values of the operation management table T.

Figure 3:
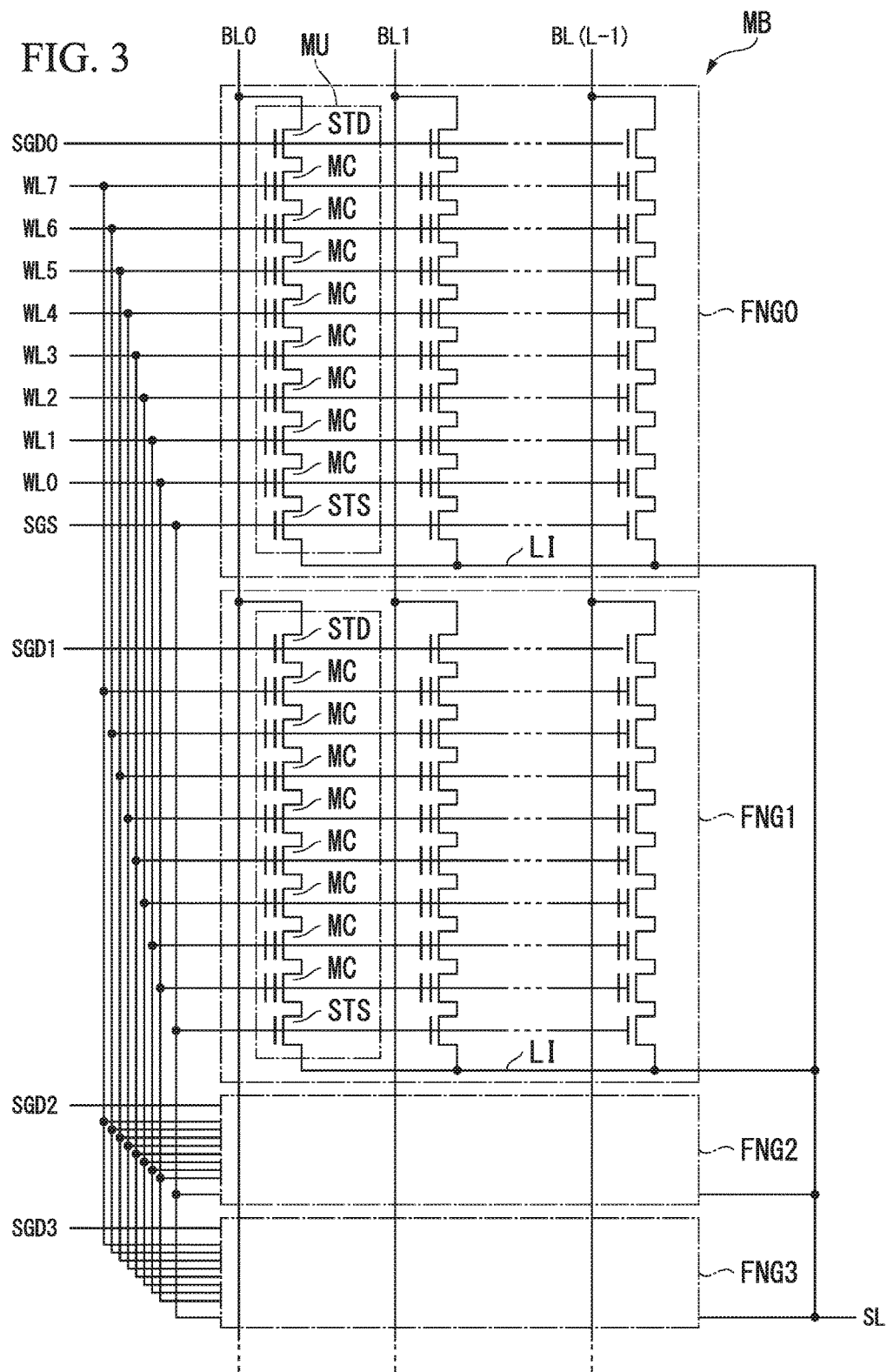
FIG. 3 is an equivalent circuit diagram of a memory cell array according to the first embodiment.

Next, the configuration of the memory cell array 41 will be described. FIG. 3 shows an example of an equivalent circuit of the memory cell array 41.

As shown in FIG. 3, each memory block MB includes a plurality of fingers FNG (FNG0, FNG1,). The finger FNG is a cluster of a plurality of memory cell units MU (to be described below). In each finger FNG, one end of the memory cell unit MU is electrically connected to a bit line BL (BL0, BL1, . . . ). The other end of the memory cell unit MU is electrically connected to a source line SL via a source contact LI.

Each memory cell unit MU includes a plurality of memory cells MC, a source-side select transistor STS, and a drain-side select transistor STD.

The plurality of memory cells MC is electrically connected in series. Each memory cell MC is a transistor including a semiconductor layer, a charge storage layer, and a control gate. The memory cell MC stores charge in the charge storage layer according to a voltage level of a voltage applied to the control gate. The word line WL (WL0, WL1, . . . ) is commonly connected to the control gates of a plurality of memory cells MC included in different memory cell units MU. These memory cells MC are electrically connected to the row decoder 42A or the row decoder 42B via the word line WL.

The source-side select transistor STS is disposed between the plurality of memory cells MC and a source contact LI. A source-side select gate line SGS is connected to the control gate of the source-side select transistor STS. The source-side select gate line SGS is electrically connected to the row decoder 42A or the row decoder 42B. The source-side select gate line SGS selectively connects the memory cell unit MU and a semiconductor substrate 51 (see FIG. 4) according to an input signal.

The drain-side select transistor STD is disposed between the plurality of memory cells MC and the bit line BL. A drain-side select gate line SGD (SGD0, SGD1, . . . ) is connected to the control gate of the drain-side select transistor STD. The drain-side select gate line SGD is electrically connected to the row decoder 42A or the row decoder 42B. The drain-side select gate line SGD selectively connects the memory cell unit MU and the bit line BL according to an input signal.

Figure 4:
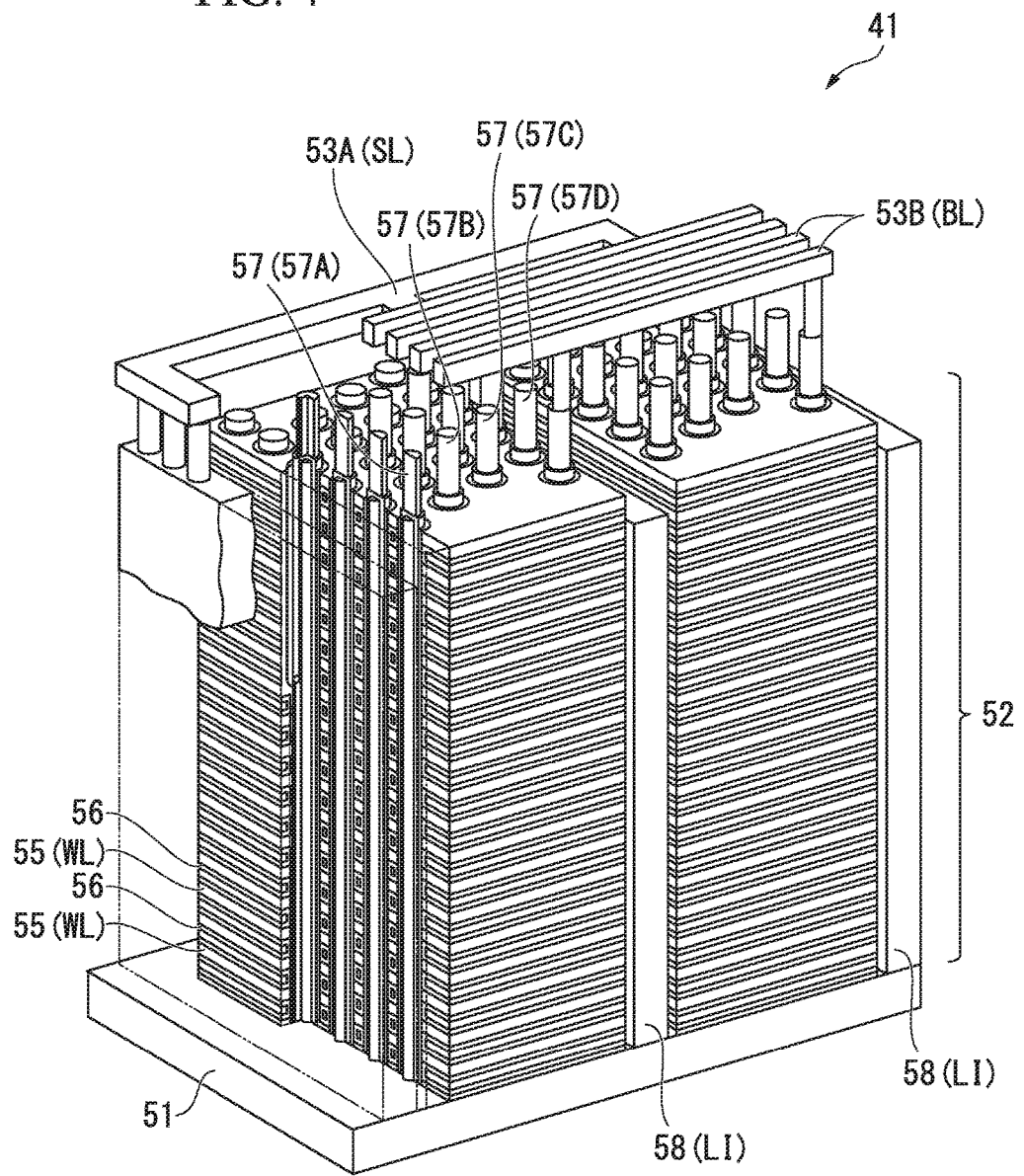
FIG. 4 is a perspective view of the memory cell array according to the first embodiment.

Next, the structure of the memory cell array 41 will be described. FIG. 4 shows an example of the structure of the memory cell array 41.

As shown in FIG. 4, the memory cell array 41 includes the semiconductor substrate 51, a stack 52, and a plurality of conductive lines 53A and 53B.

The semiconductor substrate 51 is an example of a "substrate" and is formed in a planar form. The semiconductor substrate 51 is a base for the stack 52. That is, the semiconductor substrate 51 is a base on which conductive layers and insulating layers are laminated.

The stack 52 is formed on the semiconductor substrate 51. The stack 52 includes at least a plurality of conductive layers 55, a plurality of insulating layers 56, a plurality of pillars 57, a plurality of memory cells MC, and a plurality of conductive layers 58.

The plurality of conductive layers 55 and the plurality of insulating layers 56 are alternately disposed in a thickness direction of the semiconductor substrate 51. The plurality of conductive layers 55 forms the plurality of word lines WL, the source-side select gate line SGS, and the drain-side select gate line SGD. The plurality of insulating layers 56 electrically insulates the plurality of conductive layers 55.

The plurality of pillars 57 extends in at least a part of the stack 52 in the thickness direction of the semiconductor substrate 51. The plurality of pillars 57 may reach or may not reach the semiconductor substrate 51. The plurality of pillars 57 becomes narrow gradually as the pillars approach the semiconductor substrate 51 due to manufacturing reasons, for example. The source-side select transistor STS is formed between each pillar 57 and the source-side select gate line SGS. The memory cell MC is formed between each pillar 57 and each word line WL. The drain-side select transistor STD is formed between each pillar 57 and the drain-side select gate line SGD. In the present embodiment, four pillars 57 are commonly connected to each word line WL (WL0, WL1, . . . ), for example. The plurality of memory cells MC, the source-side select transistor STS, and the drain-side select transistor STD formed by the respective pillars 57 may be referred to as a "string" or "string chunk".

The conductive layer 58 extends in the thickness direction of the semiconductor substrate 51. The conductive layer 58 is in contact with the semiconductor substrate 51 and forms the source contact LI that electrically connects the source line SL and the semiconductor substrate 51. The plurality of conductive lines 53A is disposed on the opposite side of the semiconductor substrate 51 with respect to the pillars 57. The plurality of conductive lines 53A is electrically connected to the pillars 57 to form the bit lines BL. On the other hand, the conductive line 53B is electrically connected to the conductive layer 58 to form the source line SL.

Figure 5:
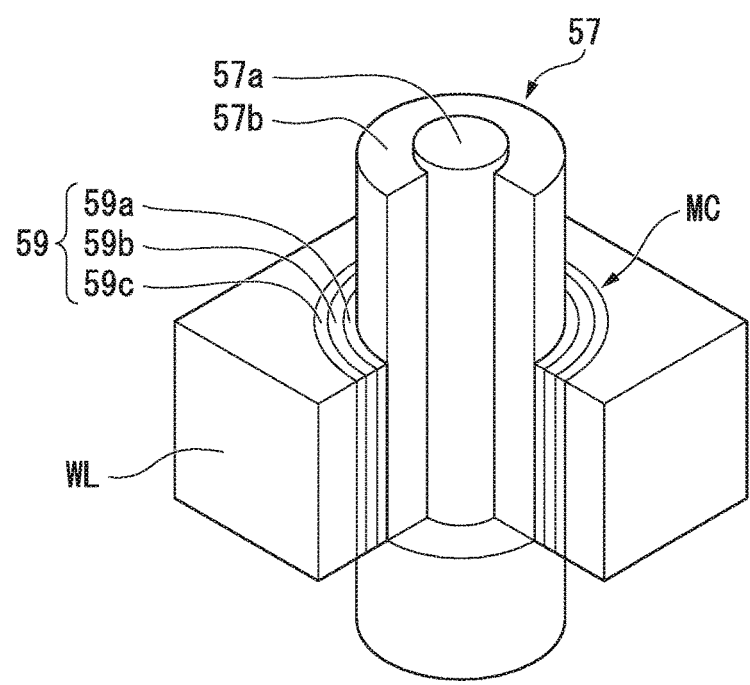
FIG. 5 is a perspective view of a memory cell according to the first embodiment.

FIG. 5 shows an example of a configuration of the memory cell MC. As shown in FIG. 5, the memory cell MC is formed between the word line WL and the pillar 57. For example, the memory cell MC is formed between the word line WL and a circumferential surface of the pillar 57.

For example, the pillar 57 includes a core insulating layer 57a and a semiconductor layer 57b. The semiconductor layer 57b covers a side surface (e.g., a circumferential surface) of the core insulating layer 57a. The semiconductor layer 57b is formed of polysilicon (Poly-Si), for example, and functions as a channel of the memory cell MC. The memory cell MC is formed by a multilayer film 59 disposed between the word line WL and the semiconductor layer 57b of the pillar 57. The multilayer film 59 includes a tunnel insulating film 59a, a charge storage layer 59b, and a cover insulating layer 59c. The tunnel insulating film 59a is formed of silicon oxide ($SiO_2$), for example. The charge storage layer 59b is formed of a material capable of storing charge such as silicon nitride (SiN), for example. The cover insulating layer 59c is formed of silicon oxide ($SiO_2$), for example. Due to such a configuration, the semiconductor layer 57b functions as a channel, the word line WL functions as a control gate, and charge (i.e., electrons) is stored in the charge storage layer 59b by voltages being applied to the word line WL and the bit line BL.

Figure 6:
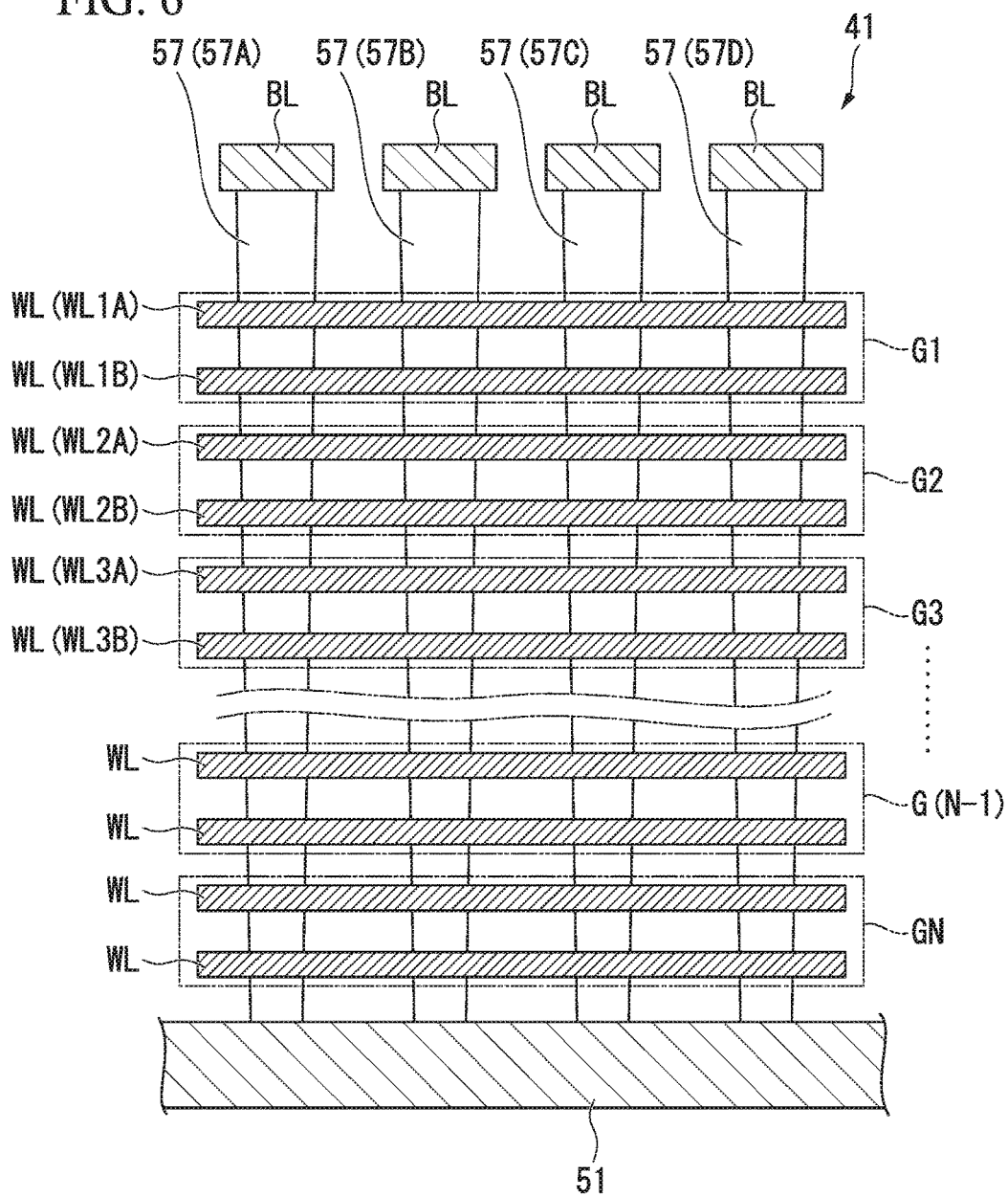
FIG. 6 is a schematic cross-sectional view of the memory cell array according to the first embodiment.

FIG. 6 is a cross-sectional view of the memory cell array 41. The insulating layers 56 are not shown in FIG. 6. As shown in FIG. 6, in the present embodiment, the plurality of word lines WL arranged in the thickness direction of the semiconductor substrate 51 is classified into a plurality of groups G (first group G1, second group G2, third group G3, . . . , (N−1)th group, and N-th group). The "group" used in the present embodiment means a management unit in which the voltage levels of voltages applied to the word lines WL are set to be substantially the same for one operation (for example, a write operation, a read operation, or an erase operation) of the memory system 1, for example, and means a management unit defined by one word line WL or a plurality of word lines WL which are united into one set by being adjacent each other. That is, as an example of the definition of the "management unit," a plurality of word lines WL separated by being disposed on both sides of at least one word line WL belong to different groups (that is, different management units). The grouping of the word lines WL may be set in advance for each NAND chip 40 and may be set later by a controller 61 (to be described below) of the memory system 1. Moreover, the grouping of the word lines WL may be set fixedly and may be changed dynamically according to a fatigue level and other states of the memory cells MC. Although FIG. 6 schematically shows two word lines WL in each group G, this is an example only. Each group G may include three or more word lines WL. Moreover, only one word line WL may be included in each group G. In this case, voltages of different voltage levels are applied to the respective word lines WL of the plurality of word lines WL. Moreover, the numbers of word lines WL included in the respective groups G may be different.

In the present embodiment, the memory system 1 includes a voltage application unit 60 that applies voltages of arbitrary voltage levels to the plurality of groups of word lines WL. For example, the voltage application unit 60 applies voltages of different voltage levels to the respective groups G of the word lines WL. The voltage application unit 60 is realized by the voltage generation circuit 46, the controller 48, and firmware executed by the CPU 31 of the back end 14, for example. In other words, the voltage generation circuit 46 is controlled by the firmware executed by the CPU 31 of the back end 14 via the controller 48 of the NAND chip 40, whereby voltages of different voltage levels are applied to respective groups G of the word lines WL. The firmware executed by the CPU 31 of the back end 14 is an example of a "controller". The firmware executed by the CPU 31 controls the voltage levels of the voltages applied to the plurality of word lines WL, for example.

As shown in FIG. 6, the plurality of pillars 57 narrows gradually as the pillars 57 approach the semiconductor substrate 51. Due to this, a dimension (for example, the diameter) of the memory cell MC is smaller as the memory cell MC is located closer to the semiconductor substrate 51. As the dimension of the memory cell MC is smaller, when a voltage of substantially the same voltage level as that for a memory cell MC having a larger dimension is applied to the memory cells, an electric field generated in the memory cell MC having the smaller dimension increases. When a large electric field is generated in the memory cell MC, fatigue of the memory cell MC is likely to progress. Therefore, in the present embodiment, the voltage application unit 60 applies voltages of different voltage levels to a group of word lines WL located further away from the semiconductor substrate 51 (the group of word lines WL in which the memory cells MC have relatively large dimensions) and a group of word lines WL located closer to the semiconductor substrate 51 (the group of word lines WL in which the memory cells MC have relatively small dimensions). For example, the voltage application unit 60 applies a voltage of a relatively high voltage level to the group of word lines WL located further away from the semiconductor substrate 51 and applies a voltage of a relatively low voltage level to the group of word lines WL located closer to the semiconductor substrate 51.

More specifically, in the present embodiment, the plurality of word lines WL arranged in the thickness direction of the semiconductor substrate 51 is classified into a plurality of N groups G (first group G1, second group G2, third group G3, . . . , (N−1)th group, and N-th group). Word lines WL1A and WL1B included in the first group G1 are examples of a "first word line". Word lines WL2A and WL2B included in the second group G2 are examples of a "second word line". Word lines WL3A and WL3B included in the third group G3 are examples of a "third word line". The second group G2 (for example, second word lines WL2A and WL2B) is located closer to the semiconductor substrate 51 in the thickness direction of the semiconductor substrate 51 than the first group G1 (for example, first word lines WL1A and WL1B). The third group G3 (for example, third word lines WL3A and WL3B) is located closer to the semiconductor substrate 51 in the thickness direction of the semiconductor substrate 51 than the second group G2 (for example, second word lines WL2A and WL2B).

During one operation of the memory system 1, the voltage application unit 60 applies a first voltage to the first group G1 (for example, the first word lines WL1A and WL1B), applies a second voltage having a different voltage level from the first voltage to the second group G2 (for example, the second word lines WL2A and WL2B), and applies a third voltage having a different voltage level from the first and second voltages to the third group G3 (for example, the third word lines WL3A and WL3B). For example, the second voltage is lower in voltage level than the first voltage. For example, the third voltage is lower in voltage level than the second voltage. Furthermore, the voltage application unit 60 applies a voltage that is lower in voltage level than the third voltage to the (N−1)th group and applies a still lower voltage to the N-th group.

For example, during a write operation on one data set, the voltage application unit 60 applies a first voltage V1A to the first group G1 (for example, the first word lines WL1A and WL1B), applies a second voltage V2A having a different voltage level from the first voltage V1A to the second group G2 (for example, the second word lines WL2A and WL2B), and applies a third voltage V3A having a different voltage level from the first and second voltages V1A and V2A to the third group G3 (for example, the third word lines WL3A and WL3B). For example, the second voltage V2A is lower in voltage level than the first voltage V1A. For example, the third voltage V3A is lower in voltage level than the second voltage V2A. The "data set" indicates a cluster of data that is significant as the cluster in a write operation (or a read operation), for example.

Furthermore, during a read operation on one data set, the voltage application unit 60 applies a first voltage V1B to the first group G1 (for example, the first word lines WL1A and WL1B), applies a second voltage V2B having a different voltage level from the first voltage V1B to the second group G2 (for example, the second word lines WL2A and WL2B), and applies a third voltage V3B having a different voltage level from the first and second voltages V1B and V2B to the third group G3 (for example, the third word lines WL3A and WL3B). For example, the second voltage V2B is lower in voltage level than the first voltage V1B. For example, the third voltage V3B is lower in voltage level than the second voltage V2B.

Furthermore, during a data erase operation, the voltage application unit 60 may apply a first voltage V1C to the first group G1 (for example, the first word lines WL1A and WL1B), apply a second voltage V2C having a different voltage level from the first voltage V1C to the second group G2 (for example, the second word lines WL2A and WL2B), and apply a third voltage V3C having a different voltage level from the first and second voltages V1C and V2C to the third group G3 (for example, the third word lines WL3A and WL3B). For example, the second voltage V2C is lower in voltage level than the first voltage V1C. For example, the third voltage V3C is lower in voltage level than the second voltage V2C.

Next, the control of the memory system 1 for realizing the above-described operation will be described. In the following description, firmware executed by the CPU 31 of the back end 14 will be referred to as a "controller 61".

FIG. 7 shows an example of the operation management table T. As shown in FIG. 7, the values of various parameters which affect the performance and the operation of the NANDs 33A to 33D are managed in the operation management table T. In one embodiment, each row of the operation management table T stores parameters which affect the performance and the operation of a different one the NANDs 33A to 33D. In another embodiment, each row of the operation management table T stores parameters which affect the performance and the operation of a different NAND chip in the NANDs 33A to 33D. Various parameters include values such as, for example, the set number of write operations, the temperature (for example, the temperature detected by the temperature sensor 26a), a set access frequency, a set access speed, and voltages to be applied to the word lines WL and the bit lines BL. The voltages to be applied include at least one of write voltages, read voltages, and erasure voltages with respect to the word lines WL and the bit lines BL, for example. Various parameters may include the number of erases, the number of loops, the number of reads, and a resting time, for example. As described above, the operation management table T is stored in the ROM 23 of the front end 13 or the ROM 47 of the NAND chip 40, for example. Instead of this, the operation management table T may be stored in the DRAM 22. The controller 61 of the memory system 1 obtains operation parameters to be used for determining write voltages, read voltages, and erasure voltages with respect to the word lines WL and the bit lines BL by referring to the operation management table T. The operation parameter is an example of a "parameter". The "operation parameter" means information for giving operation conditions. Due to this, the "operation parameter" may be referred to as "information related to a target value". In the present embodiment, the controller 61 applies voltages of desired voltage levels to different groups G by controlling the voltage generation circuit 46 of each NAND chip 40 on the basis of the operation parameters of write voltages, read voltages, and erases voltage with respect to the word lines WL.

Next, an operation parameter setting method will be described. In the following description, a method for setting the operation parameters of write voltages will be described as a representative example. A method for setting the operation parameters of read voltages or erase voltages is substantially the same as the method for setting the operation parameters of write voltages.

FIG. 8 schematically shows an example of an operation parameter setting method.

As shown in FIG. 8, a common base parameter X is set for all groups G (for example, all word lines WL), for example. The common base parameter X is an example of a "base parameter". The "base parameters" in the present application mean parameters to be used in combination with offset values for the convenience of description. For that reason, "base parameter (or common base parameter)" may be replaced with "parameter," "predetermined parameter," or "parameter stored in a storage unit". The "storage unit" herein is the ROM 47 of the NAND chip 40, for example, but is not limited thereto.

The common base parameter X is a parameter set commonly (that is, uniformly) to all groups G (for example, all word lines WL), for example. "Set commonly" in the present application may be replaced with "used commonly". That is, a parameter being set commonly for AA and BB ("AA" and "BB" are arbitrary) means the parameter being used for calculation of AA (for example, deriving of operation parameters of AA) and also used for calculation of BB (for example, deriving of operation parameters of BB). The common base parameter X is stored in the ROM 47 of each NAND chip 40, for example. The ROM 47 is an example of a "first storage unit". The first storage unit is not limited to the ROM 47 of the NAND chip 40. In this example, only one common base parameter X is shown as a representative example. However, a plurality of common base parameters may be set. In this case, the controller 61 may change the common base parameters to be used according to a fatigue level of the memory cell MC or the like.

In the present embodiment, different parameter offset values ($\alpha$, $\beta$, $\gamma$, ..., $\mu$, $\nu$) are set for a plurality of groups G (first group G1, second group G2, third group G3, ..., (N−1)th group, N-th group). For example, the parameter offset value $\alpha$ set for the first group G1 (for example, the word lines WL1A and WL1B) is an example of a "first offset value". Similarly, the parameter offset value $\beta$ set for the second group G2 (for example, the word lines WL2A and WL2B) is an example of a "second offset value". The parameter offset value $\gamma$ set for the third group G3 (for example, the word lines WL3A and WL3B) is an example of a "third offset value". The parameter offset values $\alpha$, $\beta$, and $\gamma$ are different values. The parameter offset values ($\alpha$, $\beta$, $\gamma$, ..., $\mu$, $\nu$) are values for setting different operation parameters to respective groups G by being added to the base parameter X, for example. "Offset" used in the present embodiment means a "relative shift from a base point". The parameter offset value (or the offset value) may be subtracted, multiplied, or divided with respect to the base parameter X without being limited to being added to the base parameter X. That is, the parameter offset value (the offset value) is not particularly limited as long as it is possible to change the value of the base parameter X by combining the parameter offset value with the base parameter X to set the adjusted operation parameter. In the following description, "addition" may be replaced with "subtraction," "multiplication," or "division". Moreover, an operation of performing at least one of addition, subtraction, multiplication, division, and other computations may be referred to as "modify".

These parameter offset values ($\alpha$, $\beta$, $\gamma$, ..., $\mu$, $\nu$) are stored in the ROM 23 of the front end 13, for example. The ROM 23 is an example of a "second storage unit". The second storage unit is not limited to the ROM 23 of the front end 13. Moreover, in this example, only one parameter offset value of each group G is shown as a representative example. However, a plurality of parameter offset values may be set for each group G In this case, the parameter offset value to be used may be changed according to a fatigue level or the like of the memory cell MC.

In the present embodiment, the controller 61 sets the operation parameters of each group G on the basis of the common base parameter X and the parameter offset values ($\alpha$, $\beta$, $\gamma$, ..., $\mu$, $\nu$) corresponding to each group G. For example, the controller 61 sets values obtained by adding the parameter offset values ($\alpha$, $\beta$, $\gamma$, ..., $\mu$, $\nu$) to the common base parameter X as the operation parameters of each group G. For example, the operation parameter (X+$\alpha$) set in correspondence to the first group G1 is an example of a "first parameter" to be used for determining a voltage level of a voltage to be applied to the first group G1 (for example, the word lines WL1A and WL1B). Similarly, the operation parameter (X+$\beta$) set in correspondence to the second group G2 is an example of a "second parameter" to be used for determining a voltage level of a voltage to be applied to the second group G2 (for example, the word lines WL2A and WL2B). The operation parameter (X+$\gamma$) set in correspondence to the third group G3 is an example of a "third parameter" to be used for determining a voltage level of a voltage to be applied to the third group G3 (for example, the word lines WL3A and WL3B). The operation parameters of each group G set by the controller 61 are stored in the DRAM 22 as a part of the operation management table T (or separately from the operation management table T), for example. Instead, the operation parameters of each group G set by the controller 61 may be stored in the ROM 47 of the NAND chip 40, the ROM 23 of the front end 13, or another storage unit. Moreover, the operation parameters of each group G set by the controller 61 may be used as they are rather than being stored in the DRAM 22 or the like. The controller 61 controls the voltage generation circuit 46 of the NAND chip 40 on the basis of the operation parameters set in correspondence to each group G.

In the present embodiment, the controller 61 sets a value for applying a first voltage to the first group G1 as an operation parameter (that is, a first parameter) set in correspondence to the first group G1 on the basis of the common base parameter X and the parameter offset value α. Furthermore, the controller 61 sets a value for applying a second voltage having a lower voltage level than the first voltage to the second group G2 as an operation parameter (that is, a second parameter) set in correspondence to the second group G2 on the basis of the common base parameter X and the parameter offset value β. Furthermore, the controller 61 sets a value for applying a third voltage having a lower voltage level than the second voltage to the third group G3 as an operation parameter (that is, a third parameter) set in correspondence to the third group G3 on the basis of the common base parameter X and the parameter offset value γ.

Moreover, the controller 61 controls the voltage generation circuit 46 so that substantially the same voltage is applied to the plurality of word lines WL1A and WL1B included in the first group G1 on the basis of the operation parameter (that is, the first parameter) set in correspondence to the first group G1. Similarly, the controller 61 controls the voltage generation circuit 46 so that substantially the same voltage is applied to the plurality of word lines WL2A and WL2B included in the second group G2 on the basis of the operation parameter (that is, the second parameter) set in correspondence to the second group G2. The controller 61 controls the voltage generation circuit 46 so that substantially the same voltage is applied to the plurality of word lines WL3A and WL3B included in the third group G3 on the basis of the operation parameter (that is, the third parameter) set in correspondence to the third group G3.

Next, a case in which a write voltage is controlled by a bias voltage and a step voltage will be described as an example of the control of the write voltage.

Figures 9, 10:
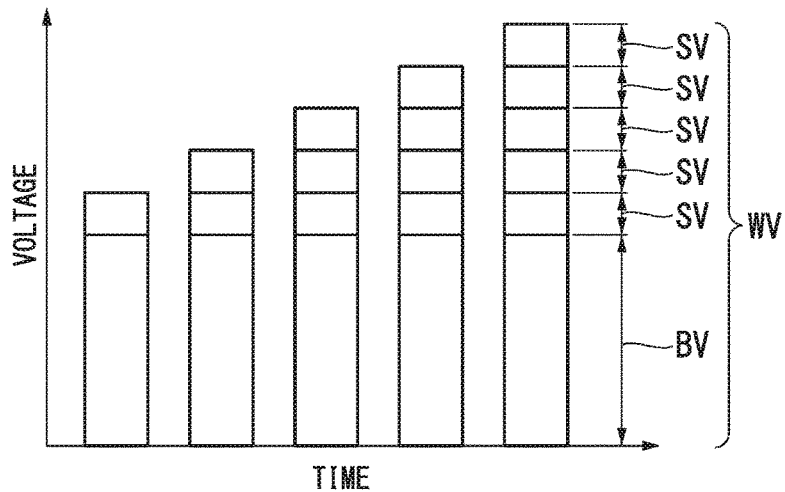
FIG. 9 illustrates a bias voltage and a step voltage according to the first embodiment.
FIG. 10 illustrates an example of the operation parameter setting method according to the first embodiment.

FIG. 9 shows an example of a bias voltage and a step voltage. As shown in FIG. 9, an example of a write voltage WV is the sum of a bias voltage BV and at least a step voltage SV. The bias voltage BV is a voltage (that is, a threshold voltage of a transistor) which serves as the potential of a floating gate of the memory cell MC, for example, and is controlled to be a constant voltage regardless of the amount of charge stored in the memory cell MC. On the other hand, the step voltage SV is a voltage applied to the memory cell MC in addition to the bias voltage and is varied gradually according to the amount of charge stored in the memory cell MC. For example, the step voltage SV may be gradually increased as the amount of charge stored in the memory cell MC increases.

FIG. 10 schematically shows an example of a method for setting the operation parameters of the bias voltage and the step voltage.

As shown in FIG. 10, the common base parameter X includes a common base bias parameter Y and a common base step parameter y. The common base bias parameter Y is a parameter to be used for determining the magnitude of the bias voltage and is set commonly (that is, equally) to all word lines WL. The common base step parameter y is a parameter to be used for determining the magnitude of the step voltage and is set commonly (that is, equally) for all word lines WL. The common base bias parameter Y and the common base step parameter y are stored in the ROM 47 of each NAND chip 40, for example. The common base parameter X is an example of a compound parameter. Each of the common base bias parameter Y and the common base step parameter y is an example of a sub parameter.

Similarly, the parameter offset values (α, β, γ, . . . , μ, ν) set to a plurality of groups G each include a bias parameter offset value (A, B, C, . . . , M, N), and a step parameter offset value (a, b, c, . . . , m, n). The bias parameter offset value is an offset value added to the common base bias parameter Y. The plurality of bias parameter offset values (A, B, C, . . . , M, N) are different values. The step parameter offset value is an offset value added to the common base step parameter y. The plurality of step parameter offset values (a, b, c, . . . , m, n) are different values. The bias parameter offset value and the step parameter offset value are stored in the ROM 23 of the front end 13, for example.

In the present embodiment, the controller 61 sets an operation parameter (Y+A, Y+B, Y+C, . . . , Y+M, Y+N) of the bias voltage of each group G on the basis of the common base bias parameter Y and the bias parameter offset value (A, B, C, . . . , M, N) set in correspondence to each group G. For example, the controller 61 sets a value obtained by adding the bias parameter offset value (A, B, C, . . . , M, N) to the common base bias parameter Y as the operation parameter of the bias voltage of each group G. For example, the operation parameter (Y+A) set in correspondence to the first group G1 is an example of a "first bias parameter" to be used for determining the magnitude of the bias voltage applied to the first group G1 (for example, the word lines WL1A and WL1B). Similarly, the operation parameter (Y+B) set in correspondence to the second group G2 is an example of a "second bias parameter" to be used for determining the magnitude of the bias voltage applied to the second group G2 (for example, the word lines WL2A and WL2B).

On the other hand, the controller 61 calculates the operation parameter (y+a, y+b, y+c, . . . , y+m, y+n) of the step voltage of each group G on the basis of the common base step parameter y and the step parameter offset value (a, b, c, m, n) set in correspondence to each group G. For example, the controller 61 sets a value obtained by adding the step parameter offset value (a, b, c, . . . , m, n) to the common base step parameter y as the operation parameter of the step voltage of each group G. For example, the operation parameter (y+a) set in correspondence to the first group G1 is an example of a "first step parameter" to be used for determining the magnitude of the step voltage applied to the first group G1 (for example, the word lines WL1A and WL1B). Similarly, the operation parameter (y+b) set in correspondence to the second group G2 is an example of a "second step parameter" to be used for determining the magnitude of the step voltage applied to the second group G2 (for example, the word lines WL2A and WL2B).

Figure 11:
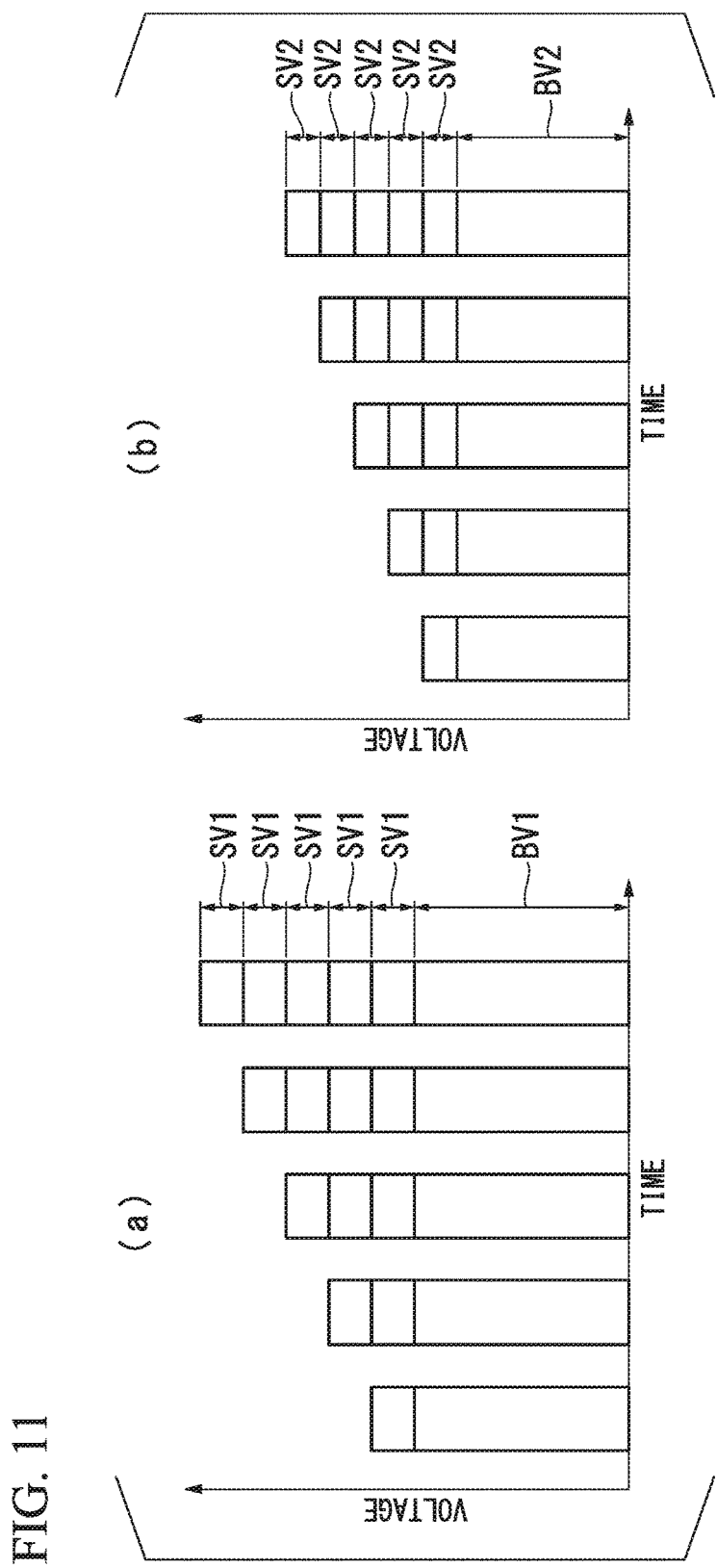
FIG. 11 illustrates an adjusted bias voltage and an adjusted step voltage according to the first embodiment.

FIG. 11 shows an example of an adjusted bias voltage and an adjusted step voltage. (a) of FIG. 11 shows a bias voltage BV1 and a step voltage SV1 for the first group G1 (for example, the word lines WL1A and WL1B). (b) of FIG. 11 shows a bias voltage BV2 and a step voltage SV2 for the second group G2 (for example, the word lines WL2A and WL2B).

As shown in FIG. 11, the controller 61 sets the first parameter (X+α) on the basis of the first bias parameter (Y+A) to be used for determining the magnitude of the bias voltage BV1 applied to the first group G1 (for example, the word lines WL1A and WL1B) and the first step parameter (y+a) to be used for determining the magnitude of the step voltage SV1 applied to the first group G1 (for example, the word lines WL1A and WL1B) in addition to the bias voltage BV1. Similarly, the controller 61 sets the second parameter (X+β) on the basis of the second bias parameter (Y+B) to be used for determining the magnitude of the bias voltage BV2 applied to the second group G2 (for example, the word lines WL2A and WL2B) and the second step parameter (y+b) to be used for determining the magnitude of the step voltage SV2 applied to the second group G2 (for example, the word lines WL2A and WL2B) in addition to the bias voltage BV2. Here, the controller 61 sets the second bias parameter so that the magnitude of the bias voltage BV2 applied to the second group G2 (for example, the word lines WL2A and WL2B) has a lower voltage level than the magnitude of the bias voltage BV1 applied to the first group G1 (for example, the word lines WL1A and WL2B). Furthermore, the controller 61 sets the second step parameter so that the magnitude of the step voltage SV2 applied to the second group G2 (for example, the word lines WL2A and WL2B) has a lower voltage level than the magnitude of the step voltage SV1 applied to the first group G1 (for example, the word lines WL1A and WL1B). In this way, the controller 61 controls the voltage generation circuit 46 so that the first voltage is applied to the first group G1 (for example, the first word lines WL1A and WL1B) and the second voltage lower than the first voltage is applied to the second group G2 (for example, the second word lines WL2A and WL2B). Instead, the controller 61 may set the second bias parameter so that the magnitude of the bias voltage BV1 applied to the first group G1 is substantially the same as the magnitude of the bias voltage BV2 applied to the second group G2 and may set the second step parameter so that the magnitude of the step voltage SV2 applied to the second group G2 has a lower voltage level than the magnitude of the step voltage SV1 applied to the first group G1. Alternatively, the controller 61 may set the second step parameter so that the magnitude of the step voltage SV1 applied to the first group G1 is substantially the same as the magnitude of the step voltage SV2 applied to the second group G2 and may set the second bias parameter so that the magnitude of the bias voltage BV2 applied to the second group G2 has a lower voltage level than the magnitude of the bias voltage BV1 applied to the first group G1.

Figure 12:
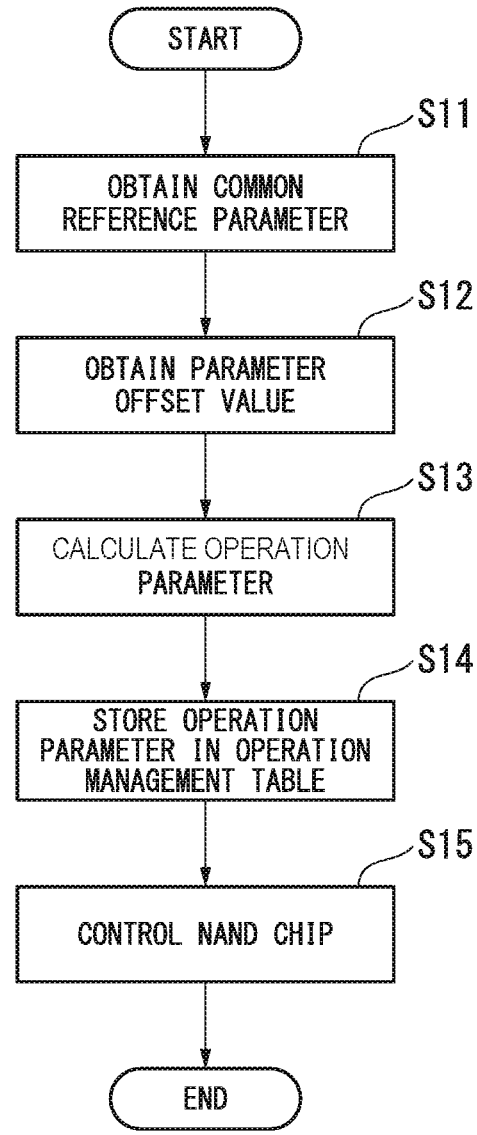
FIG. 12 is a flowchart showing a flow of a processing operation according to the first embodiment.

Next, the process flow of the controller 61 will be described. FIG. 12 shows an example of the process flow of the controller 61.

As shown in FIG. 12, first, the controller 61 obtains a common base parameter (for example, a common base bias parameter and a common base step parameter) from the ROM 47 of the NAND chip 40 (step S11). Subsequently, the controller 61 obtains parameter offset value (for example, a bias parameter offset value and a step parameter offset value) set to each group G from the ROM 23 of the front end 13 (step S12).

The controller 61 calculates and sets the operation parameter of each group G on the basis of the common base parameter and the parameter offset value (step S13). Subsequently, the controller 61 stores the set operation parameters in the operation management table T (step S14). Moreover, the controller 61 controls the NAND chip 40 on the basis of the operation parameters stored in the operation management table T (step S15). The operation of step S14 may be omitted. In this case, the controller 61 may control the NAND chip 40 on the basis of the operation parameters temporarily retained in the DRAM 22 or the like, for example.

According to such a configuration, it is possible to apply more appropriate operation conditions to a plurality of groups G of word lines WL. For example, in the present embodiment, the controller 61 sets a first parameter to be used for determining a voltage level of a voltage applied to first word lines WL1A and WL1B and a second parameter to be used for determining a voltage level of a voltage applied to second word lines WL2A and WL2B on the basis of a base parameter set commonly for the first word lines WL1A and WL1B and the second word lines WL2A and WL2B and at least one offset value with respect to at least one of a write operation, a read operation, and an erase operation. In this way, voltages of different voltage levels are applied to the first word lines WL1A and WL1B and the second word lines WL2A and WL2B. In this way, it is possible to apply voltages to the word lines WL by taking characteristics of variation in the memory blocks MBs into consideration, for example. As a result, it is possible to suppress fatigue of the memory cells MC and to extend the lifespan of an apparatus, for example.

For example, in the present embodiment, the memory system 1 includes a 3-dimensional memory in which a plurality of word lines WL and a plurality of insulating layers 56 are alternately disposed in the thickness direction of the semiconductor substrate 51. The plurality of word lines WL include the first group G1 and the second group G2 located closer to the semiconductor substrate 51 than the first group G1 in the thickness direction of the semiconductor substrate 51. The controller 61 sets the first parameter to be used for determining the voltage level of a voltage applied to the first group G1 and the second parameter to be used for determining the voltage level of a voltage applied to the second group G2 on the basis of the base parameter set commonly for the first and second groups G1 and G2 and at least one offset value. According to such a configuration, it is possible to apply voltages of appropriate voltage levels to respective memory cells MC even when the dimensions of the memory cells MC corresponding to the first group G1 are different from the dimensions of the memory cells MC corresponding to the second group G2 due to manufacturing restrictions of 3-dimensional memories, for example. In this way, it is possible to reduce the fatigue of the memory cells MC and to extend the lifespan of an apparatus, for example.

In the present embodiment, the plurality of pillars 57 becomes narrower as the pillars approach the semiconductor substrate 51 due to manufacturing reasons, for example. Due to this, the memory cells MC located closer to the semiconductor substrate 51 have smaller dimensions (for example, a diameter) than those of the memory cells MC located further away from the semiconductor substrate 51, and an electric field is generated more in the memory cells MC located closer to the semiconductor substrate 51 than in the memory cells MC located further away from the semiconductor substrate 51. In the present embodiment, the controller 61 sets a value for applying the first voltage to the first group G1 as the first parameter on the basis of the base parameter and the first offset value. The controller 61 sets a value for applying the second voltage having a lower voltage level than the first voltage to the second group G2 as the second parameter on the basis of the base parameter and the second offset value. According to such a configuration, it is possible to suppress application of an excessively high voltage to memory cells MC having relatively small dimensions and to reduce the fatigue of the memory cells MC.

However, the configuration of the present embodiment is not limited to the above-described example. For example, the controller 61 may set a value for applying the first voltage to the first group G1 as the first parameter on the basis of the base parameter and the first offset value. Moreover, the controller 61 may set a value for applying the second voltage having a higher voltage level than the first voltage to the second group G2 as another example of the second parameter on the basis of the base parameter and another example of the second offset value. According to such a configuration, when the dimensions (for example, the diameter) of the memory cells MC located further away from the semiconductor substrate 51 are larger than the diameter of the memory cells MC located closer to the semiconductor substrate 51 or the like, due to manufacturing reasons, for example, it is possible to suppress application of an excessively high voltage to the memory cells MC having relatively small dimensions and to reduce the fatigue of the memory cells MC.

First Modified Example

Next, a memory system 1 according to a first modified example of the first embodiment will be described. In the first embodiment, an operation of applying voltages of different voltage levels to a plurality of groups G is carried out by the controller 61. The present modified example is different from the first embodiment in that the operation of applying voltages of different voltage levels to the plurality of groups G is carried out by a plurality of circuits 46A to 46N which is hardware. The configuration other than the configuration to be described below is the same as that of the first embodiment.

Figure 13:
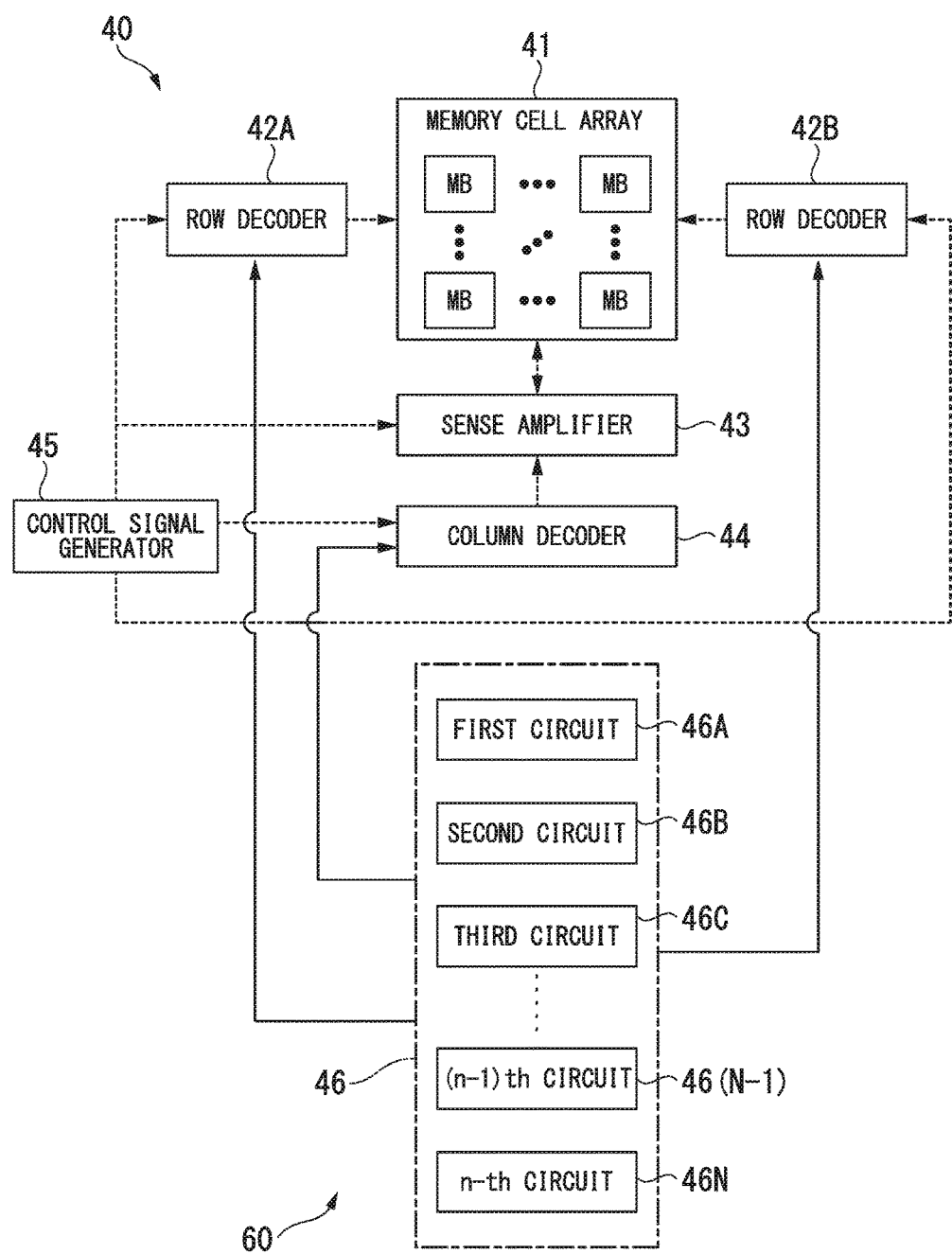
FIG. 13 is a block diagram of a memory system according to a first modified example of the first embodiment.

FIG. 13 shows an example of the memory system 1 according to the first modified example.

As shown in FIG. 13, in the present modified example, the voltage generation circuit 46 includes a plurality of circuits 46A to 46N provided in correspondence to the plurality of groups G. The plurality of circuits 46A to 46N include a first circuit 46A, a second circuit 46B, a third circuit 46C, . . . , a (N−1)th circuit 46(N−1), and an N-th circuit 46N. The first circuit 46A is electrically connected to the first group G1 (for example, the word lines WL1A and WL1B) and applies a first voltage to the first group G1 (for example, the word lines WL1A and WL1B). The second circuit 46B is electrically connected to the second group G2 (for example, the word lines WL2A and WL2B) and applies a second voltage different from the first voltage to the second group G2 (for example, the word lines WL2A and WL2B). The third circuit 46C is electrically connected to the third group G3 (for example, the word lines WL3A and WL3B) and applies a third voltage different from the first and second voltages to the third group G3 (for example, the word lines WL3A and WL3B). For example, the second voltage is lower than the first voltage. For example, the third voltage is lower than the second voltage.

According to such a configuration, similarly to the first embodiment, it is possible to apply more appropriate operation conditions to the plurality of groups G of word lines WL.

Second Modified Example

Next, a memory system 1 according to a second modified example of the first embodiment will be described. The present modified example is different from the first embodiment in that the operation parameters are changed according to an average fatigue level of a plurality of memory cells MC. The configuration other than the configuration to be described below is the same as that of the first embodiment.

FIG. 14 schematically shows an example of an operation parameter setting method according to the present modified example.

As shown in FIG. 14, a plurality of parameter offset values (an offset value for a first fatigue level range, an offset value for a second fatigue level range, . . . , and an offset value for an n-th fatigue level range) corresponding to an average fatigue level of a plurality of memory cells MC is set in advance for each group G. The plurality of parameter offset values is stored in the ROM 23 of the front end 13, for example. The "average fatigue level" means an average value of the fatigue levels of the plurality of memory cells MC. Although the fatigue level may be the number of writes, for example, instead of this, the fatigue level may be the number of reads, the number of erases, and other indicators. "For a fatigue level range" means "corresponding to a fatigue level range".

The controller 61 selects offset values ($\alpha_1, \beta_1, \gamma_1, \ldots, \mu_1, \nu_1$) corresponding to a first fatigue level range from a plurality of parameter offset values as parameter offset values to be added to the base parameter X when an average fatigue level of the plurality of memory cells MC is in the first fatigue level range. The offset value ($\alpha_1, \beta_1, \gamma_1, \ldots, \mu_1, \nu_1$) is an offset value to be used instead of the parameter offset value ($\alpha, \beta, \gamma, \ldots, \mu, \nu$) of the first embodiment and is used for setting the operation parameter to be used for determining a voltage level of a voltage applied to each group G.

In the present modified example, in a case where the controller 61 determines that the average fatigue level of the plurality of memory cells MC is in the first fatigue level range, the controller 61 sets a "first parameter" to be used for a voltage level of a voltage applied to the first group G1 (for example, the word lines WL1A and WL1B) and a "second parameter" to be used for determining a voltage level of a voltage applied to the second group G2 (for example, the word lines WL2A and WL2B) on the basis of the base parameter X, an offset value $\alpha_1$ corresponding to the first group G1, and an offset value $\beta_1$ corresponding to the second group G2. In the present modified example, when the average fatigue level of the plurality of memory cells MC is in the first fatigue level range, the controller 61 sets the first and second parameters so that a difference between the voltage level of the voltage applied to the first group G1 and the voltage level of the voltage applied to the second group G2 is in a first voltage difference range.

On the other hand, in a case where the controller 61 determines that the average fatigue level of the plurality of memory cells MC is in a second fatigue level range that is higher than the first fatigue level range, for example, the controller 61 selects offset values ($\alpha_2, \beta_2, \gamma_2, \ldots, \mu_2, \nu_2$) corresponding to the second fatigue level range from the plurality of parameter offset values as the parameter offset values to be added to the base parameter X. The offset value ($\alpha_2, \beta_2, \gamma_2, \ldots, \mu_2, \nu_2$) is an offset value used instead of the parameter offset value ($\alpha, \beta, \gamma, \ldots, \mu, \nu$) of the first embodiment and is used for setting the operation parameter to be used for determining the voltage level of the voltage applied to each group G.

In the present modified example, when it is determined that the average fatigue level of the plurality of memory cells MC is in the second fatigue level range, the controller 61 sets a "first parameter" to be used for determining the voltage level of the voltage applied to the first group G1 (for example, the word lines WL1A and WL1B) and a "second parameter" to be used for determining the voltage level of the voltage applied to the second group G2 (for example, the word lines WL2A and WL2B) on the basis of the base parameter X, the offset value $\alpha_2$ corresponding the first group G1, and the offset value $\beta_2$ corresponding to the second group G2. In the present modified example, when the average fatigue level of the plurality of memory cells MC is in the second fatigue level range, the controller 61 sets the first and second parameters so that a difference between the voltage level of the voltage applied to the first group G1 and the voltage level of the voltage applied to the second group G2 is in a second voltage difference range that is different from the first voltage difference range. For example, the difference between the voltage level of the voltage applied to the first group G1 and the voltage level of the voltage applied to the second group G2 in the second voltage difference range is larger than that of the first voltage difference range. In other words, when the average fatigue level of the plurality of memory cells MC transitions from the first fatigue level range to the second fatigue level range, the controller 61 changes the first and second parameters so that the difference between the voltage level of the voltage applied to the first group G1 and the voltage level of the voltage applied to the second group G2 increases. Moreover, when the average fatigue level of the plurality of memory cells MC transitions from the first fatigue level range to the second fatigue level range, the controller 61 may change only one of the first and second parameters rather than changing both first and second parameters.

Next, the process flow of the controller 61 according to the present modified example will be described.

Figure 15:
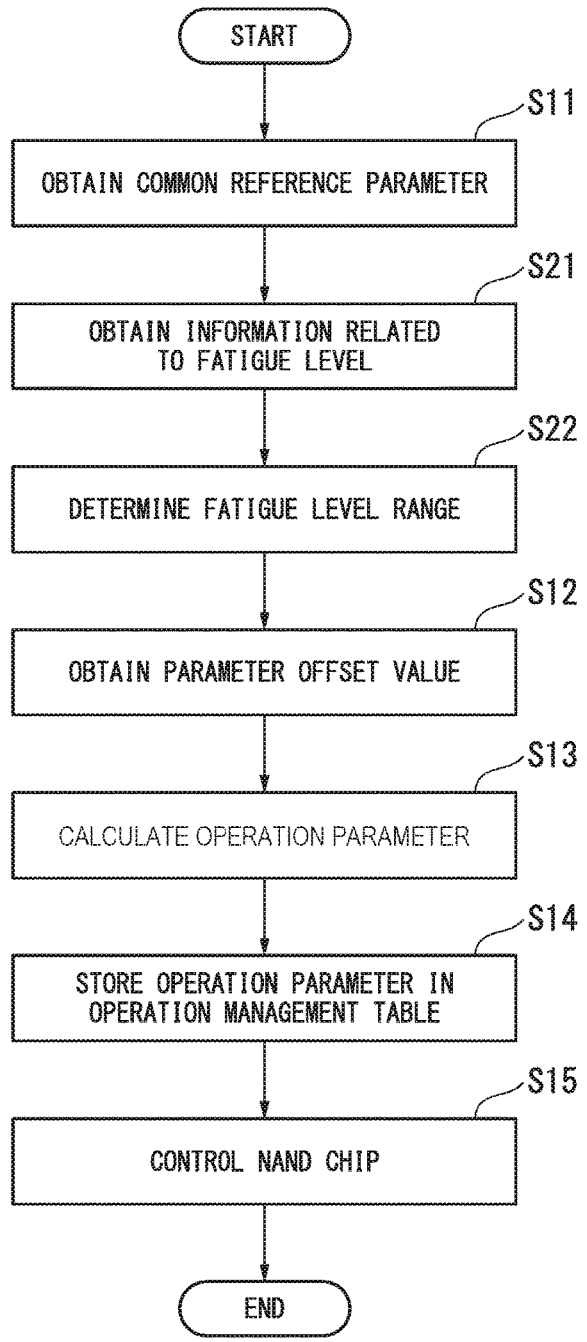
FIG. 15 is a flowchart showing a process flow according to the second modified example of the first embodiment.

FIG. 15 shows an example of the process flow of the controller 61 according to the present modified example. Since the operations of steps S11, S12, S13, S14, and S15 are substantially the same as the operations of steps S11, S12, S13, S14, and S15 of the first embodiment, the description thereof will be omitted.

As shown in FIG. 15, the controller 61 obtains information (for example, at least one of the number of writes, the number of reads, and the number of erases) related to the average fatigue level of the plurality of memory cells MC by referring to the operation management table T or another table, for example (step S21). Moreover, the controller 61 determines a fatigue level range to which the average fatigue level of the plurality of memory cells MC belongs on the basis of the information related to the average fatigue level and predetermined thresholds (step S22). Steps S21 and S22 may be performed prior to step S11.

Moreover, the controller 61 selects and obtains parameter offset values corresponding to a fatigue level range to which the average fatigue level of the plurality of memory cells MC belongs from a plurality of parameter offset values on the basis of the determined fatigue level range (step S13). Moreover, the controller 61 sets an operation parameter to be used for determining a voltage level of a voltage applied to each group G on the basis of the common base parameter X and the parameter offset value corresponding to the average fatigue level of the plurality of memory cells MC. In this way, the operation parameter is changed according to the average fatigue level of the plurality of memory cells MC. The operations of steps S21, S22, and S12 to S15 of the present modified example are periodically performed by the controller 61. In this way, the operation parameter is dynamically changed according to a change in the average fatigue level of the plurality of memory cells MC.

According to such a configuration, the voltage level of the voltage applied to each group G can be individually adjusted according to the average fatigue level of the plurality of memory cells MC. In this way, it is possible to suppress fatigue of the memory cells MC and to extend the lifespan of an apparatus, for example.

Second Embodiment

Next, a memory system 1 according to a second embodiment will be described. In the first embodiment, a plurality of word lines WL is classified into a plurality of groups G, and operation parameters for applying voltages of different voltage levels are set to respective groups G. The present embodiment is different from the first embodiment in that a plurality of regions (a plurality of memory cells MC) defined by a combination of the word lines WL and the pillars 57 (that is, strings) is classified into a plurality of groups G, and operation parameters for applying voltages of different voltage levels are set to respective groups G. The configuration other than the configuration to be described below is the same as that of the first embodiment.

In the present embodiment, similarly to the first embodiment, a plurality of (for example, four) pillars 57 is commonly connected to each word line WL (see FIG. 4). That is, the memory cell MC is formed between each word line WL and a plurality of (for example, four) pillars 57.

FIG. 16 schematically shows grouping according to the present embodiment. As shown in FIG. 16, in the present embodiment, a plurality of memory cells MC is classified into a plurality of groups G (a plurality of groups (1,1), (2,2), . . . , (i,3), (i,4)) by a combination of a plurality of word lines WL and a plurality of pillars 57 (that is, a plurality of strings). For example, the plurality of word lines WL includes a first word line WL1, a second word line WL2, a third word line WL3, . . . , and the like. Similarly, the plurality of pillars 57 includes a first pillar 57A, a second pillar 57B, a third pillar 57C, and a fourth pillar 57D, for example. These four pillars 57A, 57B, 57C, and 57D extend and pass through the same word line WL, for example.

As an example, a memory cell MC defined by a combination of the first word line WL1 and the first pillar 57 and a memory cell MC defined by a combination of the second word line WL2 and the first pillar 57 are classified into the group (1,1). Similarly, a memory cell MC defined by a combination of the first word line WL1 and the second pillar 57 and a memory cell MC defined by a combination of the second word line WL2 and the second pillar 57 are classified into the group (1,2). A memory cell MC defined by a combination of the first word line WL1 and the third pillar 57 and a memory cell MC defined by a combination of the second word line WL2 and the third pillar 57 are classified into the group (1,3). A memory cell MC defined by a combination of the first word line WL1 and the fourth pillar 57 and a memory cell MC defined by a combination of the second word line WL2 and the fourth pillar 57 are classified into the group (1,4). By a similar definition, the groups (2,1), (2,2), . . . , (i,3), and (i,4) are defined as shown in FIG. 16. Here, the memory cells MC included in the group (1,1) are an example of a "first memory cell". The memory cells MC included in the group (1,2) are an example of a "second memory cell". The memory cells MC included in the group (1,3) are an example of a "third memory cell". A grouping method of the memory cells MC is not limited to the above-described example.

In the present embodiment, the controller 61 sets operation parameters for applying voltages of different voltage levels to the plurality of groups (1,1), (2,2), . . . , (i,3), and (i,4) defined by a combination of a plurality of word lines WL and a plurality of pillars 57. In the present embodiment, for example, the common base parameter X is set to all groups (1,1), (2,2), . . . , (i,3), and (i,4), for example. The common base parameter X is commonly (that is, equally) set to all groups, for example. Moreover, in the present embodiment, different parameter offset values ($\alpha$, $\beta$, $\gamma$, . . . ) are set to the plurality of groups (1,1), (2,2), . . . , (i,3), (i,4). The parameter offset value $\alpha$ set to the group (1,1) (for example, the first memory cells) is an example of a "first offset value (a third offset value in another viewpoint)". The parameter offset value $\beta$ set to the group (1,2) (for example, the second memory cells) is an example of a "second offset value (a fourth offset value in another viewpoint)". The parameter offset value $\gamma$ set to the group (1,3) (for example, the third memory cells) is an example of a "third offset value".

In the present embodiment, the controller 61 sets the operation parameters of the respective groups (1,1), (2,2), . . . , (i,3), and (i,4) on the basis of the common base parameter X and the parameter offset values ($\alpha$, $\beta$, $\gamma$, . . . ) corresponding to the respective groups (1,1), (2,2), . . . , (i,3), and (i,4). For example, the controller 61 sets values obtained by adding different parameter offset values to the common base parameter X as the operation parameters of the groups (1,1), (2,2), . . . , (i,3), and (i,4). For example, the operation parameter set in correspondence to the group (1,1) is an example of a "first parameter (a third parameter in another viewpoint)" to be used for determining a voltage level of a voltage applied to the memory cells included in the group (1,1). Similarly, the operation parameter set in correspondence to the group (1,2) is an example of a "second parameter (or a fourth parameter in another viewpoint)" to be used for determining a voltage level of a voltage applied to the memory cells included in the group (1,2). The operation parameter set in correspondence to the group (1,3) is an example of a "third parameter" to be used for determining a voltage level of a voltage applied to the memory cells included in the group (1,3). In a similar manner, the operation parameters are set to the groups (2,1), (2,2), . . . , (i,3), and (i,4). Moreover, the controller 61 controls the voltage generation circuit 46 of the NAND chip 40 on the basis of the operation parameters set in correspondence to the groups (1,1), (2,2), . . . , (i,3), and (i,4).

According to such a configuration, it is possible to apply voltages of different voltage levels to respective groups G defined by a combination of a plurality of word lines WL and a plurality of pillars 57. In this way, even when the groups G defined by a combination of a plurality of word lines WL and a plurality of pillars 57 have different dimensions due to manufacturing reasons, it is possible to apply voltages of appropriate voltage levels to the respective groups G and to reduce the fatigue of the memory cells MC, for example. In one example, voltages of different voltage levels to respective groups G by applying voltages of different voltage levels to the bit lines BL (i.e., by applying voltages of different voltage levels to the pillar 57).

Third Embodiment

Next, a memory system 1 according to a third embodiment will be described. In the first embodiment, a plurality of word lines WL disposed in a stack in the thickness direction of the semiconductor substrate 51 is classified into a plurality of groups G, and an operation parameter is set for each groups G. The present embodiment is different from the first embodiment in that a plurality of word lines WL arranged in a planar form on the surface of the semiconductor substrate 51 is classified into a plurality of groups G, and the operation parameter is set for each groups G. The configuration other than the configuration to be described below is the same as that of the first embodiment.

Figure 17:
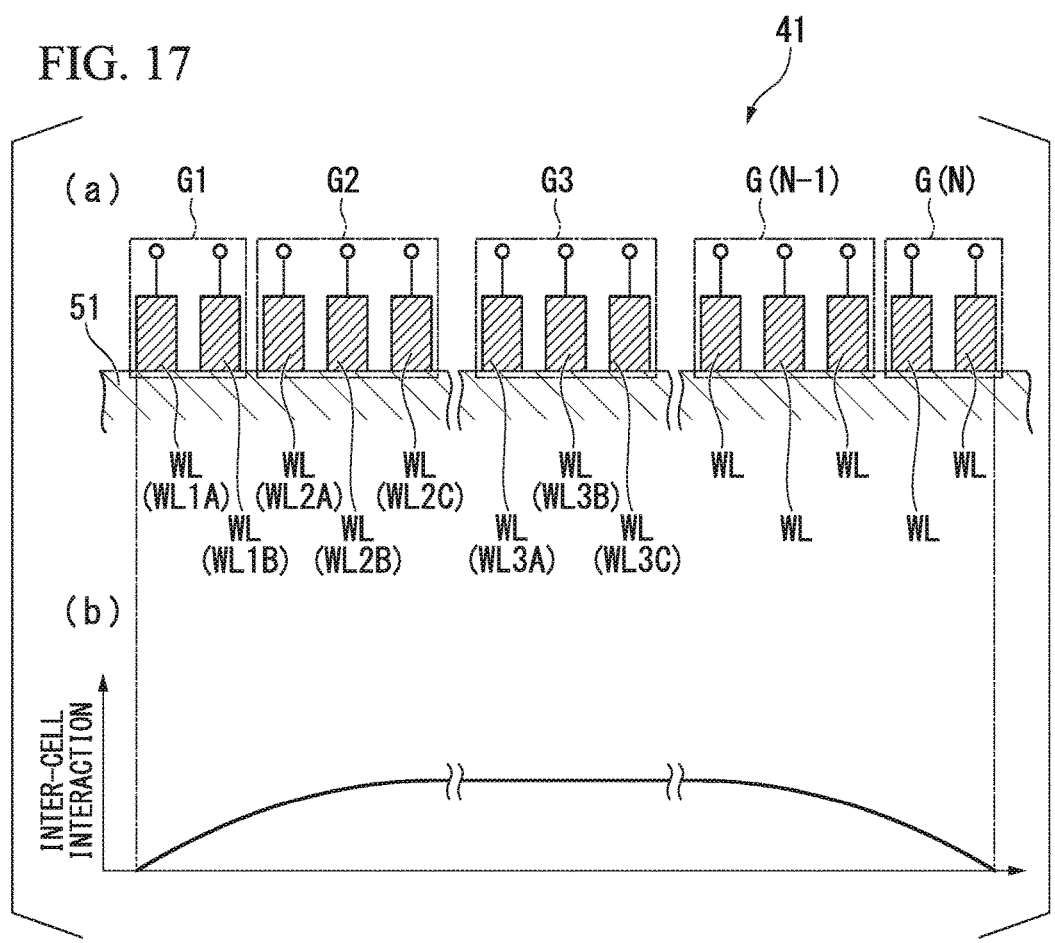
FIG. 17 is a schematic cross-sectional view of a memory cell array according to a third embodiment.

FIG. 17 schematically shows a memory cell array 41 according to the present embodiment. In FIG. 17, (a) shows grouping of word lines WL. In FIG. 17, (b) shows inter-cell interaction acting on word lines WL. Note that, the insulating layer 56 is not shown in FIG. 17.

As shown in FIG. 17, the memory cell array 41 according to the present embodiment includes a plurality of word lines WL. The plurality of word lines WL are arranged in a direction crossing the extension direction of these word lines WL. For example, the plurality of word lines WL are arranged in a direction substantially parallel to the surface of the semiconductor substrate 51. The plurality of word lines WL is classified into a plurality of groups G.

More specifically, in the present embodiment, the plurality of word lines WL arranged in a direction substantially parallel to the surface of the semiconductor substrate 51 is classified into N groups G (first group G1, second group G2, third group G3, . . . , (N−1)th group, and N-th group). Word lines WL and WL included in the first group G1 are examples of a "first word line". Word lines WL2A, WL2B, and WL2C included in the second group G2 are examples of a "second word line". Word lines WL3A, WL3B, and WL3C included in the third group G3 are examples of a "third word line". The first group G1 may or may not include the word line WL1 located at an endmost position of the plurality of word lines WL. The second group G2 (for example, the second word lines WL2A, WL2B, and WL2C) is located further away from the endmost position (that is, the endmost word line WL1A) of the plurality of word lines WL as compared to the first group G1 (for example, the first word lines WL1A and WL1B). The third group G3 (for example, the third word lines WL3A, WL3B, and WL3C) is located further away from the endmost position (that is, the endmost word line WL1A) of the plurality of word lines WL as compared to the second group G2 (for example, the second word lines WL2A, WL2B, and WL2C).

In one example, the word line WL1A is a first endmost word line of the plurality of the word lines WL. A word line WL(N) included in the group G(N) is a second endmost word line of the plurality of the word lines WL. The second endmost word line is located opposite to the first endmost word line in the plurality of the word lines WL. The word lines WL1B, WL2A, WL2B, WL2C, WL3A, WL3B, WL3C are located between the first endmost word line and the second endmost word line.

From another viewpoint, the plurality of word lines WL includes the first word line WL1A and the second word line WL2A. The first word line WL1A is included in the first group G1 located close to the endmost position of the plurality of word lines WL. The second word line WL2A is included in the second group G2 located closer to the central portion of the plurality of word lines WL as compared to the first word line WL1A. The second word line WL2A has a larger ordinal number counted from the endmost word line among the plurality of word lines WL than the first word line WL1A. The "ordinal number" used in the present embodiment is an ordinal number counted from an endmost word line that is located closer to a target word line WL among the word lines at both endmost positions (hereinafter referred to as "endmost word lines") included in the plurality of word lines WL. The first word line WL1A may be the endmost word line.

During one operation of the memory system 1, the voltage application unit 60 applies a first voltage to the first group G1 (for example, the first word lines WL1A and WL1B), applies a second voltage having a different voltage level from the first voltage to the second group G2 (for example, the second word lines WL2A, WL2B, and WL2C), and applies a third voltage having a different voltage level from the first and second voltages to the third group G3 (for example, the third word lines WL3A, WL3B, and WL3C). For example, the second voltage is lower than the first voltage. For example, the third voltage is lower than the second voltage. For example, during a write operation of one data set (or a read operation or an erase operation of one data set), the voltage application unit 60 applies the first voltage to the first group G1 (for example, the first word lines WL1A and WL1B), applies the second voltage lower than the first voltage to the second group G2 (for example, the second word lines WL2A, WL2B, and WL2C), and applies the third voltage lower than the first and second voltages to the third group G3 (for example, the third word lines WL3A, WL3B, and WL3C).

In the present embodiment, similarly to the first embodiment, a common base parameter X is set to all groups G (for example, all word lines WL), for example. The common base parameter X is set commonly (that is, equally) to all groups G (for example, all word lines WL), for example.

In the present embodiment, for example, parameter offset values ($\alpha$, $\beta$, $\gamma$, . . . , $\mu$, $\nu$) are set to a plurality of (for example, N) groups G (first group G1, second group G2, third group G3, . . . , (N−1)th group, N-th group). For example, the parameter offset value $\alpha$ set to the first group G1 (for example, the word lines WL1A and WL1B) is an example of a "first offset value". Similarly, the parameter offset value $\beta$ set to the second group G2 (for example, the word lines WL2A, WL2B, and WL2C) is an example of a "second offset value". The parameter offset value $\gamma$ set to the third group G3 (for example, the word lines WL3A, WL3B, and WL3C) is an example of a "third offset value". The parameter offset values $\alpha$, $\beta$, and $\gamma$ are different from each other. In the present embodiment, similarly to the first embodiment, the controller 61 sets the operation parameter of each group G on the basis of the common base parameter X and the parameter offset value ($\alpha$, $\beta$, $\gamma$, . . . , $\mu$, $\nu$) corresponding to each group G.

In this way, the controller 61 controls the voltage generation circuit 46 so that substantially the same voltage is applied to the plurality of word lines WL1A and WL1B included in the first group G1 on the basis of the operation parameter (that is, the first parameter) set in correspondence to the first group G1. Similarly, the controller 61 controls the voltage generation circuit 46 so that substantially the same voltage is applied to the plurality of word lines WL2A, WL2B, and WL2C included in the second group G2 on the basis of the operation parameter (that is, the second parameter) set in correspondence to the second group G2. The controller 61 controls the voltage generation circuit 46 so that substantially the same voltage is applied to the plurality of word lines WL3A, WL3B, and WL3C included in the third group G3 on the basis of the operation parameter (that is, the third parameter) set in correspondence to the third group G3.

According to such a configuration, it is possible to apply more appropriate operation conditions to a plurality of groups G of word lines WL. For example, in the present embodiment, the plurality of word lines WL is arranged in the direction substantially parallel to the surface of the semiconductor substrate 51. In such a case, as shown in (b) of FIG. 17, an electric field is generated in a word line WL located close the central portion of the plurality of word lines WL due to inter-cell interaction (for example, the Yupin effect received from adjacent word lines WL). On the other hand, an electric field is less likely to be generated in a word line WL located close to the end of the plurality of word lines WL. Therefore, in the present embodiment, the plurality of word lines WL include the first group G1 and the second group G2 located closer to the central portion of the plurality of word lines WL than the first group G1. Moreover, the controller 61 sets the first parameter to be used for determining a voltage level of a voltage applied to the first group G1 and the second parameter to be used for determining a voltage level of a voltage applied to the second group G2 on the basis of the base parameter set commonly for the first and second groups G1 and G2 and at least one offset value. According to such a configuration, it is possible to decrease the voltage level of the voltage applied to the word lines WL in a group G in which the inter-cell interaction is relatively large. In this way, it is possible to reduce the fatigue of the memory cells MC and to extend the lifespan of the apparatus, for example.

Modified Example

Next, a memory system 1 according to a modified example of the third embodiment will be described. The present modified example is different from the third embodiment in that the operation parameter is changed according to an average fatigue level of the plurality of memory cells MC. The configuration other than the configuration to be described below is the same as that of the third embodiment.

Figure 18:
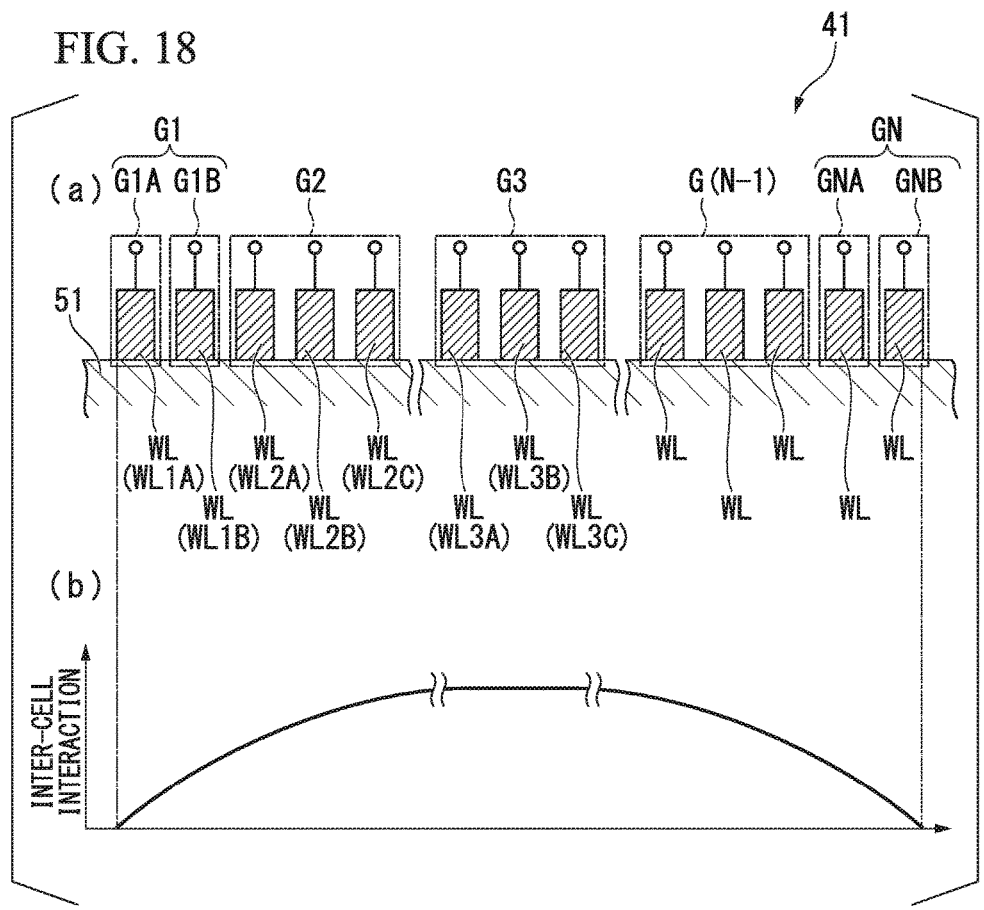
FIG. 18 is a schematic cross-sectional view of a memory cell array according to a modified example of the third embodiment.

FIG. 18 schematically shows a memory cell array 41 according to the present modified example. In FIG. 18, (a) shows grouping of word lines WL. In FIG. 18, (b) shows inter-cell interaction acting on word lines WL.

In the present modified example, similarly to the second modified example of the first embodiment, a plurality of parameter offset values (an offset value for a first fatigue level range, an offset value for a second fatigue level range, . . . , and an offset value for an n-th fatigue level range) corresponding to an average fatigue level of a plurality of memory cells MC is set in advance for each group G.

In a case where the controller 61 determines that an average fatigue level of the plurality of memory cells MC is in the first fatigue level range, the controller 61 selects offset values ($\alpha_1$, $\beta_1$, $\gamma_1$, . . . , $\mu_1$, $\nu_1$) corresponding to a first fatigue level range from a plurality of parameter offset values as parameter offset values to be added to the base parameter X. For example, in the case where the controller 61 determines that the average fatigue level of the plurality of memory cells MC is in the first fatigue level range, the controller 61 sets a "first parameter" to be used for a voltage level of a voltage applied to the first group G1 (for example, the word lines WL1A and WL1B) and a "second parameter" to be used for determining a voltage level of a voltage applied to the second group G2 (for example, the word lines WL2A and WL2B) on the basis of the base parameter X, an offset value $\alpha_1$ corresponding to the first group G1, and an offset value $\beta_1$ corresponding to the second group G2. In the present modified example, when the average fatigue level of the plurality of memory cells MC is in the first fatigue level range, the controller 61 sets the first and second parameters so that the difference between the voltage level of the voltage applied to the first group G1 and the voltage level of the voltage applied to the second group G2 is in a first voltage difference range.

On the other hand, in a case where the controller 61 determines that the average fatigue level of the plurality of memory cells MC is in a second fatigue level range that is higher than the first fatigue level range, for example, the controller 61 selects offset values ($\alpha_2$, $\beta_2$, $\gamma_2$, . . . , $\mu_2$, $\nu_2$) corresponding to the second fatigue level range from the plurality of parameter offset values as the parameter offset values to be added to the base parameter X. For example, in the case where the controller 61 determines that the average fatigue level of the plurality of memory cells MC is in the second fatigue level range, the controller 61 sets a "first parameter" to be used for determining the voltage level of the voltage applied to the first group G1 (for example, the word lines WL1A and WL1B) and a "second parameter" to be used for determining the voltage level of the voltage applied to the second group G2 (for example, the word lines WL2A and WL2B) on the basis of the base parameter X, the offset value $\alpha_2$ corresponding the first group G1, and the offset value $\beta_2$ corresponding to the second group G2. In the present modified example, when the average fatigue level of the plurality of memory cells MC is in the second fatigue level range, the controller 61 sets the first and second parameters so that a difference between the voltage level of the voltage applied to the first group G1 and the voltage level of the voltage applied to the second group G2 is in a second voltage difference range that is different from the first voltage difference range. For example, the difference between the voltage level of the voltage applied to the first group G1 and the voltage level of the voltage applied to the second group G2 in the second voltage difference range is larger than that of the first voltage difference range. In other words, when the average fatigue level of the plurality of memory cells MC transitions from the first fatigue level range to the second fatigue level range, the controller 61 changes the first and second parameters so that the difference between the voltage level of the voltage applied to the first group G1 and the voltage level of the voltage applied to the second group G2 increases. Moreover, when the average fatigue level of the plurality of memory cells MC transitions from the first fatigue level range to the second fatigue level range, the controller 61 may change only one of the first and second parameters rather than changing both first and second parameters.

Moreover, when the average fatigue level of the plurality of memory cells MC transitions from the first fatigue level range to the second fatigue level range, the controller 61 may increase the number of groups G of the word lines WL. For example, as shown in FIG. 18, the first group G1 may be further grouped into a group G1A and a group G1B. Moreover, the controller 61 may set the operation parameters so that the voltage level of a voltage applied to the group G1A (for example, the word line WL1A) is different from the voltage level of a voltage applied to the group G1B (for example, the word line WL1A). For example, the controller 61 sets a parameter to be used for determining a voltage level of a voltage applied to the group G1A (for example, the word line WL1A) and a parameter to be used for determining a voltage level of a voltage applied to the group G1B (for example, the word line WL1B) on the basis of the base parameter set commonly for the groups G1A and G1B and at least one offset value.

According to such a configuration, the voltage level of the voltage applied to each group G can be individually adjusted according to the average fatigue level of the plurality of memory cells MC. In this way, it is possible to suppress fatigue of the memory cells MC and to extend the lifespan of an apparatus, for example. For example, as shown in (b) of FIG. 18, when the fatigue level of the memory cell MC increases, substantially the same state as a state in which a larger inter-cell interaction acts is created. As a result, when the average fatigue level of the plurality of memory cells MC transitions from the first fatigue level range to the second fatigue level range, if the first and second parameters are changed so that the difference between the voltage level of the voltage applied to the first group G1 and the voltage level of the voltage applied to the second group G2 increases, it is possible to suppress application of an excessively large voltage to the word lines WL of each group G and to extend the lifespan of the apparatus.

Fourth Embodiment

Next, a memory system 1 according to a fourth embodiment will be described. In the third embodiment, the operation parameters are set so that a relatively low voltage is applied to a group G that is located closer to the central portion of the plurality of word lines WL. The fourth embodiment is different from the third embodiment in that a low voltage group G and a high voltage group G are alternately disposed. The configuration other than the configuration to be described below is the same as that of the third embodiment.

Figure 19:
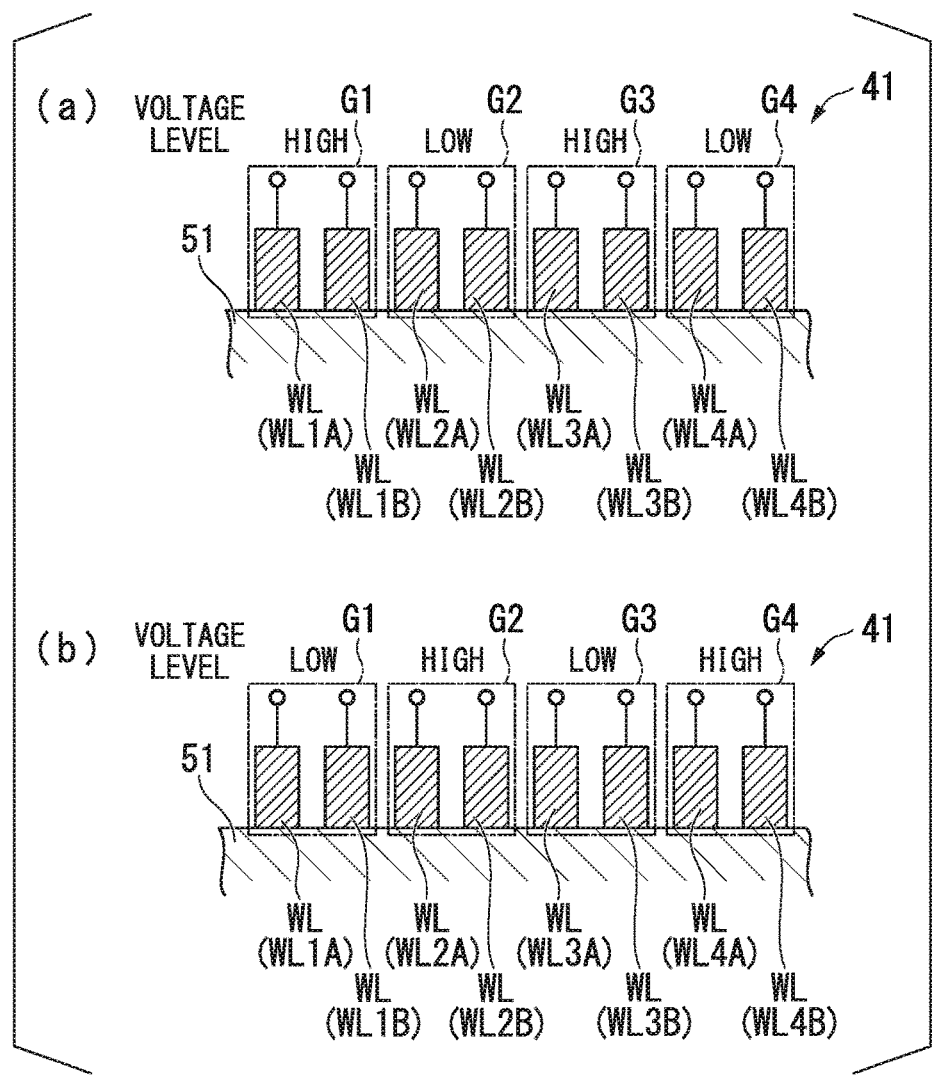
FIG. 19 is a schematic cross-sectional view of a memory cell array according to a fourth embodiment.

FIG. 19 schematically shows a memory cell array 41 according to the present embodiment. In FIG. 19, (a) shows a voltage level applied to each group G during a first write operation. In FIG. 19, (b) shows a voltage level applied to each group G during a second write operation performed subsequently to the first write operation.

As shown in FIG. 19, a plurality of word lines WL arranged in a direction substantially parallel to the surface of the semiconductor substrate 51 includes at least a first group G1 (for example, first word lines WL1A and WL1B), a second group G2 (for example, second word lines WL2A and WL2B), a third group G3 (for example, third word lines WL3A and WL3B), and a fourth group G4 (for example, fourth word lines WL4A and WL4B). The first group G1 (for example, first word lines WL1A and WL1B), the second group G2 (for example, second word lines WL2A and WL2B), the third group G3 (for example, third word lines WL3A and WL3B), and the fourth group G4 (for example, fourth word lines WL4A and WL4B) are arranged in one direction in that order. Moreover, the first group G1, the second group G2, the third group G3, and the fourth group G4 are adjacent to each other, for example.

During a first write operation, the controller 61 applies a voltage higher than a certain reference level to the first group G1 (for example, the first word lines WL1A and WL1B) and the third group G3 (for example, the third word lines WL3A and WL3B) and applies a voltage lower than the reference level to the second group G2 (for example, the second word lines WL2A and WL2B) and the fourth group G4 (for example, the fourth word lines WL4A and WL4B). In this way, voltages of high, low, high, and low voltage levels are applied to the plurality of adjacent groups G.

On the other hand, during a second write operation performed subsequently to the first write operation, the controller 61 applies a voltage lower than a certain reference level to the first group G1 (for example, the first word lines WL1A and WL1B) and the third group G3 (for example, the third word lines WL3A and WL3B) and applies a voltage higher than the reference level to the second group G2 (for example, the second word lines WL2A and WL2B) and the fourth group G4 (for example, the fourth word lines WL4A and WL4B). In this way, voltages of low, high, low, and high voltage levels are applied to the plurality of adjacent groups G. Another write operation is not performed between the first and second write operations, for example.

From another viewpoint, during the first write operation, the controller 61 controls the voltage generation circuit 46 so that a voltage lower than the voltage applied to the first word lines WL1A and WL1B is applied to the second word lines WL2A and WL2B and that a voltage lower than the voltage applied to the third word lines WL3A and WL3B is applied to the fourth word lines WL4A and WL4B. On the other hand, during the second write operation performed subsequently to the first write operation, the controller 61 controls the circuit so that a voltage higher than the voltage applied to the first word lines WL1A and WL1B is applied to the second word lines WL2A and WL2B and that a voltage higher than the voltage applied to the third word lines WL3A and WL3B is applied to the fourth word lines WL4A and WL4B. The respective voltage levels are set by setting the operation parameters to be used for determining the voltage levels on the basis of the base parameter X and the parameter offset values ($\alpha, \beta, \gamma, \ldots, \mu, \nu$) set to the respective groups G similarly to the third embodiment.

From further another view, the controller 61 controls the circuit 46, during a first write operation, to apply the first voltage to the first word lines WL1A and WL1B, to apply the second voltage that is lower than the first voltage to the second word lines WL2A and WL2B, to apply a third voltage to the third word lines WL3A and WL3B, and to apply a fourth voltage that is lower than the third voltage to the fourth word lines WL4A and WL4B. And, the controller 61 controls the circuit 46, during a second write operation that is performed after the first write operation, to apply a fifth voltage to the first word lines WL1A and WL1B, to apply the sixth voltage that is higher than the fifth voltage to the second word lines WL2A and WL2B, to apply a seventh voltage to the third word lines WL3A and WL3B, and to apply an eighth voltage that is higher in voltage level than the seventh voltage to the fourth word lines WL4A and WL4B. The first voltage may be the same as or different from the third voltage. The second voltage may be the same as or different from the fourth voltage. The fifth voltage may be the same as or different from the seventh voltage. The sixth voltage may be the same as or different from the eighth voltage. Further, the first voltage may be the same as or different from the fifth voltage and the sixth voltage. The third voltage may be the same as or different from the seventh voltage and the eighth voltage.

According to such a configuration, by weakening the inter-cell interaction on the plurality of word lines WL, it is possible to decrease the voltage required for a write operation, and to decrease the stress applied to the memory cells MC, for example. In this way, it is possible to reduce the fatigue of the memory cells MC and to extend the lifespan of the apparatus, for example.

Fifth Embodiment

Next, a memory system 1 according to a fifth embodiment will be described. In the third embodiment, an operation parameter is set so that a relatively low voltage is applied to a group G that is located closer to the central portion of the plurality of word lines WL. The present embodiment is different from the third embodiment in that voltages of different voltage levels are applied to a group G including a plurality of word lines WL disposed at a relatively wide interval and a group G including a plurality of word lines WL disposed at a relatively narrow interval. The configuration other than the configuration to be described below is the same as that of the third embodiment.

Figure 20:
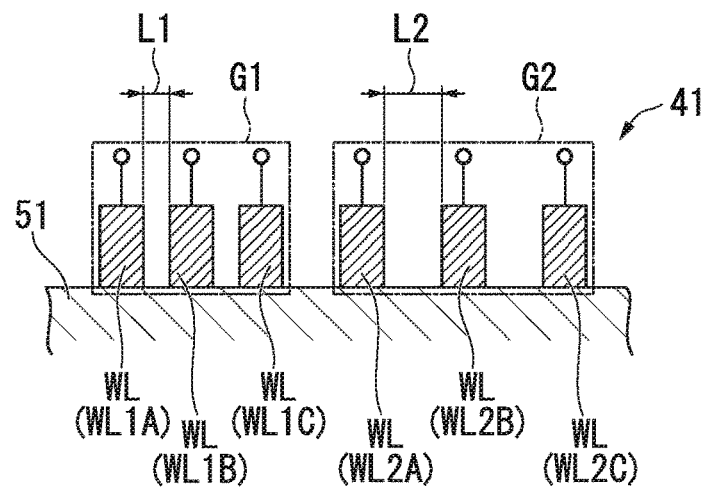
FIG. 20 is a schematic cross-sectional view of a memory cell array according to a fifth embodiment.

FIG. 20 schematically shows a memory cell array 41 according to the present embodiment. As shown in FIG. 20, a plurality of word lines WL arranged in a direction substantially parallel to the surface of the semiconductor substrate 51 includes at least a first group G1 (for example, first word lines WL1A, WL1B, and WL1C) and a second group G2 (for example, second word lines WL2A, WL2B, and WL2C). An interval L2 between the plurality of second word lines WL2A, WL2B, and WL2C included in the second group G2 is wider than an interval L1 between the plurality of first word lines WL1A, WL1B, and WL1C included in the first group G1.

During at least one of a write operation, a read operation, and an erase operation, the controller 61 applies a first voltage to a first group G1 (for example, first word lines WL1A, WL1B, and WL1C) and applies a second voltage having a different voltage level from the first voltage to a second group G2 (for example, second word lines WL2A, WL2B, and WL2C). For example, the second voltage is lower than the first voltage. The respective voltage levels are set by setting the operation parameters to be used for determining the voltage levels on the basis of the base parameter X and the parameter offset values ($\alpha, \beta, \ldots$) set to respective groups G similarly to the third embodiment.

According to such a configuration, it is possible to reduce the fatigue of the memory cells MC and to extend the lifespan of the apparatus, for example.

While the first to fifth embodiments and the modified examples thereof have been described, the embodiments are not limited to these examples. For example, in some modified examples, the operation parameter may be changed according to the average fatigue level of the plurality of memory cells. Instead, or in addition to this, the operation parameter may be changed on the basis of the temperature (for example, the temperature detected by the temperature sensor 26a) of the NAND chip or the like. At least any one of the above mentioned offset values may be zero.

As described above, an example of each of the controller 61 and the controller 48 is a software functional module realized by a processor such as a central processing unit (CPU) executing a program stored in a memory. However, a portion or the entire portion of each of the controller 61 and the controller 48 may be realized by hardware such as a large scale integration (LSI), an application specific integrated circuit (ASIC), or a field-programmable gate array (FPGA) implemented on the board 11. Moreover, a portion or the entire portion of each of the controller 61 and the controller 48 may be realized by a combination of a software functional unit and hardware.

In a memory system according to at least one of the embodiments described hereinabove, a controller obtains a base parameter and at least one offset value. The controller sets first and second parameters. The first parameter is used for determining a first voltage level of a first voltage applied to the first word line. The second parameter is used for determining a second voltage level of a second voltage applied to the second word line. In this way, it is possible to apply more appropriate operation conditions to the memory system.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
  a semiconductor memory chip including a substrate and word lines stacked in a thickness direction above the substrate, each of the word lines connecting a plurality of memory cells, the word lines including a first word line connecting first memory cells and a second word line above the first word line connecting second memory cells that are above the first memory cells, wherein a size of each of the first memory cells is different from a size of each of the second memory cells; and
  a controller configured to:
    determine an offset value with respect to each of a plurality of word line groups, each of the word line groups including a plurality of the word lines, and
    with respect to each of the word line groups, set a voltage to be applied to a word line in the word line group during at least one of write and erase operations, based on the offset value corresponding to the word line group and a base parameter value, wherein
  during the write operation, the semiconductor memory chip applies as the voltage a plurality of write voltages, one of the write voltages having a voltage level that is incremented by a step voltage from a bias voltage and others of the write voltages having a voltage level that is incremented by the step voltage from another write voltage, and
  the base parameter value corresponds to a base value of the step voltage, and the offset value corresponds to an offset value of the step voltage.

2. The memory system according to claim 1, wherein
  the plurality of word line groups includes a first word line group and a second word line group that is positioned closer to the substrate than the first word line group is, and
  the voltage set for a word line in the second word line group is lower than the voltage set for a word line in the first word line group.

3. The memory system according to claim 2, wherein
  the plurality of word line groups further includes a third word line group that is positioned closer to the substrate than the second word line group is, and
  the voltage set for a word line in the third word line group is lower than the voltage set for the word line in the second word line group.

4. The memory system according to claim 1, wherein
  the plurality of word line groups includes a first word line group and a second word line group that is positioned closer to the substrate than the first word line group is, and
  the voltage set for a word line in the second word line group is higher than the voltage set for a word line in the first word line group.

5. The memory system according to claim 1, wherein
  the semiconductor memory chip includes a plurality of voltage applying circuits each of which applies the voltage set for a word line in one of the word line groups to said one of the word line groups.

6. The memory system according to claim 1, wherein
  the controller is further configured to determine a deterioration degree with respect to each of the word line groups, and
  each of the offset values for the plurality of word line groups varies depending on the deterioration degree.

7. The memory system according to claim 1, wherein the controller is further configured to:
  determine an offset value with respect to each of a plurality of memory cell groups, each of the memory cell groups including memory cells that are connected to one of the word line groups and are formed in the thickness direction along one of a plurality of pillars that extend in the thickness direction and are arranged along a surface direction of the substrate, and
  with respect to each of the memory cell groups, set a voltage to be applied to a word line in the word line group during at least one of write and erase operations, based on the offset value corresponding to the memory cell group and the base parameter value.

8. A memory system comprising:
  a semiconductor memory chip including a substrate and word lines stacked in a thickness direction above the substrate, each of the word lines connecting a plurality of memory cells, the word lines including a first word line connecting first memory cells and a second word line above the first word line connecting second memory cells that are above the first memory cells, wherein a size of each of the first memory cells is different from a size of each of the second memory cells; and
  a controller configured to:
    determine an offset value with respect to each of a plurality of word line groups, each of the word line groups including a plurality of the word lines, and
    with respect to each of the word line groups, set a voltage to be applied to a word line in the word line group during at least one of write and erase operations, based on the offset value corresponding to the word line group and a base parameter value, wherein
  during the write operation, the semiconductor memory chip applies as the voltage a plurality of write voltages, one of the write voltages having a voltage level that is incremented by a step voltage from a bias voltage and others of the write voltages having a voltage level that is incremented by the step voltage from another write voltage, and
  the base parameter value corresponds to a base value of the bias voltage, and the offset value corresponds to an offset value of the bias voltage.

9. The memory system according to claim 8, wherein
  the plurality of word line groups includes a first word line group and a second word line group that is positioned closer to the substrate than the first word line group is, and
  the voltage set for a word line in the second word line group is lower than the voltage set for a word line in the first word line group.

10. The memory system according to claim 9, wherein
  the plurality of word line groups further includes a third word line group that is positioned closer to the substrate than the second word line group is, and
  the voltage set for a word line in the third word line group is lower than the voltage set for the word line in the second word line group.

11. The memory system according to claim 8, wherein
the plurality of word line groups includes a first word line group and a second word line group that is positioned closer to the substrate than the first word line group is, and
the voltage set for a word line in the second word line group is higher than the voltage set for a word line in the first word line group.

12. The memory system according to claim 8, wherein the semiconductor memory chip includes a plurality of voltage applying circuits each of which applies the voltage set for a word line in one of the word line groups to said one of the word line groups.

13. The memory system according to claim 8, wherein
the controller is further configured to determine a deterioration degree with respect to each of the word line groups, and
each of the offset values for the plurality of word line groups varies depending on the deterioration degree.

14. The memory system according to claim 8, wherein the controller is further configured to:
determine an offset value with respect to each of a plurality of memory cell groups, each of the memory cell groups including memory cells that are connected to one of the word line groups and are formed in the thickness direction along one of a plurality of pillars that extend in the thickness direction and are arranged along a surface direction of the substrate, and
with respect to each of the memory cell groups, set a voltage to be applied to a word line in the word line group during at least one of write and erase operations, based on the offset value corresponding to the memory cell group and the base parameter value.

15. A method for controlling a memory system including a semiconductor memory chip that includes a substrate and word lines stacked in a thickness direction above the substrate, each of the word lines connecting a plurality of memory cells, the word lines including a first word line connecting first memory cells and a second word line above the first word line connecting second memory cells that are above the first memory cells, wherein a size of each of the first memory cells is different from a size of each of the second memory cells, the method comprising:
determining an offset value with respect to each of a plurality of word line groups, each of the word line groups including a plurality of the word lines;
with respect to each of the word line groups, setting a voltage to be applied to a word line in the word line group during at least one of write and erase operations, based on the offset value corresponding to the word line group and a base parameter value; and
during the write operation, applying as the voltage a plurality of write voltages, one of the write voltages having a voltage level that is incremented by a step voltage from a bias voltage and others of the write voltages having a voltage level that is incremented by the step voltage from another write voltage, wherein
the base parameter value corresponds to a base value of the bias voltage, and the offset value corresponds to an offset value of the bias voltage.

16. The method according to claim 15, wherein
the plurality of word line groups includes a first word line group and a second word line group that is positioned closer to the substrate than the first word line group is, and
the voltage set for a word line in the second word line group is lower than the voltage set for a word line in the first word line group.

17. The method according to claim 16, wherein
the plurality of word line groups further includes a third word line group that is positioned closer to the substrate than the second word line group is, and
the voltage set for a word line in the third word line group is lower than the voltage set for the word line in the second word line group.

18. The method according to claim 15, wherein
the plurality of word line groups includes a first word line group and a second word line group that is positioned closer to the substrate than the first word line group is, and
the voltage set for a word line in the second word line group is higher than the voltage set for a word line in the first word line group.

19. The method according to claim 15, further comprising:
determining a deterioration degree with respect to each of the word line groups, wherein each of the offset values for the plurality of word line groups varies depending on the deterioration degree.

20. The method according to claim 15, further comprising:
determining an offset value with respect to each of a plurality of memory cell groups, each of the memory cell groups including memory cells that are connected to one of the word line groups and are formed in the thickness direction along one of a plurality of pillars that extend in the thickness direction and are arranged along a surface direction of the substrate; and
with respect to each of the memory cell groups, setting a voltage to be applied to a word line in the word line group during at least one of write and erase operations, based on the offset value corresponding to the memory cell group and the base parameter value.

* * * * *